(12) United States Patent
Meerheim et al.

(10) Patent No.: US 12,745,486 B2
(45) Date of Patent: Sep. 22, 2026

(54) PHOTODETECTOR WITH IMPROVED DETECTION RESULT

(71) Applicant: SENORICS GMBH, Dresden (DE)

(72) Inventors: Rico Meerheim, Dresden (DE); Robert Brückner, Freital (DE); Matthias Jahnel, Dresden (DE); Karl Leo, Dresden (DE)

(73) Assignee: SENORICS GMBH, Dresden (DE)

( * ) Notice: Subject to any disclaimer, the term of this patent is extended or adjusted under 35 U.S.C. 154(b) by 486 days.

(21) Appl. No.: 17/595,225

(22) PCT Filed: May 15, 2020

(86) PCT No.: PCT/EP2020/063660

§ 371 (c)(1),
(2) Date: Nov. 11, 2021

(87) PCT Pub. No.: WO2020/234171

PCT Pub. Date: Nov. 26, 2020

(65) Prior Publication Data

US 2022/0199840 A1 Jun. 23, 2022

(30) Foreign Application Priority Data

May 20, 2019 (DE) ..................... 10 2019 113 343.2

(51) Int. Cl.
*H10F 77/40* (2025.01)
*H10F 39/10* (2025.01)
(Continued)

(52) U.S. Cl.
CPC ......... *H10F 77/413* (2025.01); *H10F 39/103* (2025.01); *H10K 30/87* (2023.02); *H10K 39/30* (2023.02)

(58) Field of Classification Search
CPC ........... H01L 31/02327; H01L 27/1443; H01L 31/102; H01L 31/117–119; H10K 30/87;
(Continued)

(56) References Cited

U.S. PATENT DOCUMENTS 5,315,128 A * 5/1994 Hunt ..................... H01L 31/105 257/17
6,278,055 B1 * 8/2001 Forrest ................... B82Y 10/00 438/57

(Continued)

FOREIGN PATENT DOCUMENTS

JP S63-237583 A 10/1988
JP H04-101483 A 4/1992

(Continued)

OTHER PUBLICATIONS

Lao et al., "Design of Resonant-Cavity-Enhanced Multi-Band Photodetectors", Journal of Applied Physics, American Institute of Physics, US, vol. 110, No. 4, Aug. 15, 2011, pp. 43112-1-43112-7.

(Continued)

*Primary Examiner* — Bitew A Dinke
(74) *Attorney, Agent, or Firm* — HESLIN ROTHENBERG FARLEY & MESITI P.C.

(57) ABSTRACT

The invention relates to different aspects of a photodetector (1-8) for detecting electromagnetic radiation in a spectrally selective manner, comprising a first optoelectronic component (100-106, 108) for detecting a first wavelength of the electromagnetic radiation. The first optoelectronic component (100-106, 108) has a first optical cavity and at least one detection cell (21, 21*a*, 22, 22*a*, 23) arranged in the first optical cavity. The first optical cavity is made of two mutually spaced parallel mirror layers (11, 11*a*, 11', 12, 12*a*). The length of the first optical cavity is configured such that for the first wavelength, a resonant wave (13, 13*a*), (Continued)

Figure 1B:
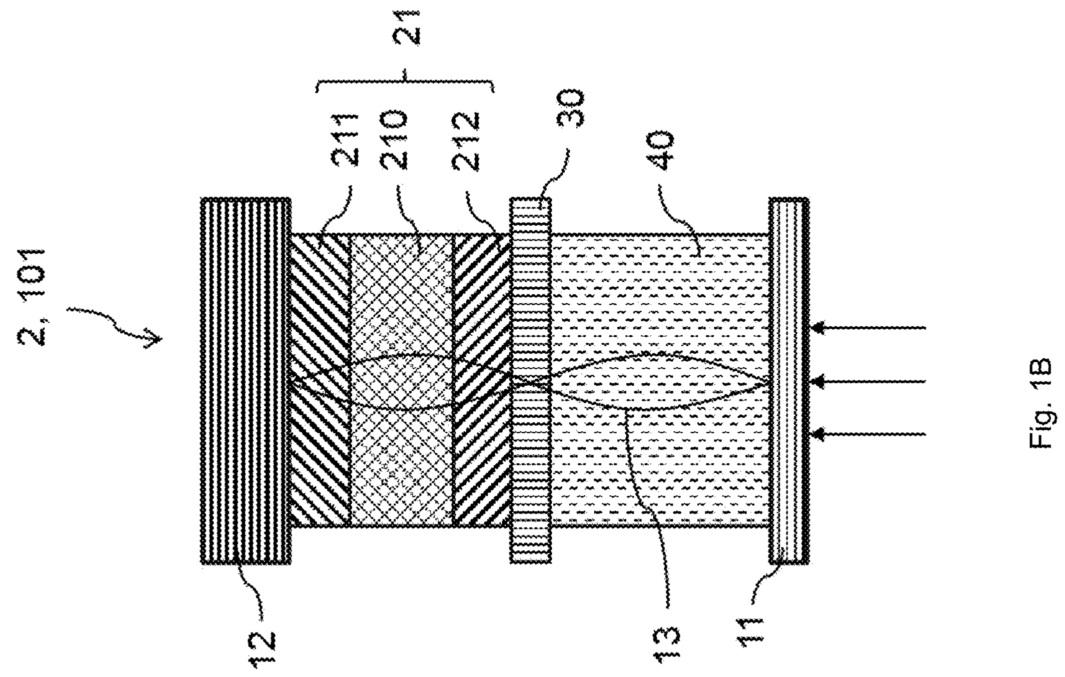

which is associated with said wavelength, of the i-th order is formed in the first optical cavity. Each detection cell (21, 21*a*, 22, 22*a*, 23) has a photoactive layer (210, 220, 230), each photoactive layer being arranged within the first optical cavity such that precisely one vibration maximum of the resonant wave (13, 13*a*) lies within the photoactive layer (210, 220, 230). According to a first aspect of the invention, the order of the resonant wave (13, 13*a*) of the first optoelectronic component (100-106, 108) is greater than 1, and at least one optically absorbent intermediate layer (30, 31) and/or at least one optically transparent contact layer (50) is arranged in the optical cavity. According to a second aspect, the first optoelectronic component (110, 110') has at least one optically transparent spacer layer (40) in addition to the detection cell (21, 21'), said spacer layer being arranged in the first optical cavity between one of the mirror layers (11, 12) and the detection cell (21, 21'), and at least one outer contact (60, 60'), which adjoins an outer surface of the detection cell (21, 21') and consists of an electrically conductive material.

14 Claims, 8 Drawing Sheets

(51) Int. Cl.
*H10K 30/87* (2023.01)
*H10K 39/30* (2023.01)

(58) Field of Classification Search
CPC ...... H10K 39/30; H10K 39/32; Y02E 10/549; H10F 77/413; H10F 39/103; H10F 30/22
See application file for complete search history.

(56) References Cited

U.S. PATENT DOCUMENTS 7,446,297 B1 * 11/2008 Sigel ........................ G11B 7/13 250/214 R
8,563,855 B2 * 10/2013 Pschirer ................. B82Y 10/00 438/57
11,158,676 B2 * 10/2021 Leem .................... H10F 39/193
11,532,671 B2 * 12/2022 Leem ................... H10K 85/652
2005/0266218 A1 * 12/2005 Peumans .............. H10K 50/852 428/216
2006/0000976 A1 * 1/2006 Brouns ................. H10F 77/413 257/E31.022
2006/0027802 A1 * 2/2006 Forrest ................... B82Y 10/00 257/40
2006/0027834 A1 * 2/2006 Forrest ................... H10K 30/30 257/183
2006/0138453 A1 * 6/2006 Thompson ............. H10K 30/20 257/E51.026
2007/0062576 A1 * 3/2007 Duerr ................... H01G 9/2027 136/263
2007/0215868 A1 * 9/2007 Forrest ................... B82Y 10/00 257/40
2007/0291808 A1 * 12/2007 Ledentsov ............ H01S 5/0601 257/E27.12
2009/0041464 A1 * 2/2009 Ledentsov ........ H01L 31/02325 398/87
2009/0218595 A1 * 9/2009 Ishimura ................ B82Y 20/00 257/E31.119
2009/0272423 A1 * 11/2009 Niira ................... H01L 31/1055 136/244
2010/0006967 A1 * 1/2010 Ishimura ............... H01L 31/105 257/E31.127
2010/0037940 A1 * 2/2010 Lim ...................... H01L 31/076 136/258
2010/0084011 A1 * 4/2010 Forrest ................... B82Y 10/00 257/E51.012
2011/0140106 A1 * 6/2011 Forbes ............. H01L 31/02327 257/E31.127
2011/0226318 A1 * 9/2011 Myong ................. H01L 31/076 257/E31.127
2012/0018744 A1 * 1/2012 Dosunmu ............. H01L 31/103 257/E31.127
2012/0138134 A1 * 6/2012 Higashikawa .......... H10F 77/48 257/E31.032
2013/0069193 A1 * 3/2013 Kishimoto ............ H01L 31/202 257/431
2013/0240847 A1 * 9/2013 Zakhidov ............... H10K 71/00 977/842
2013/0256538 A1 * 10/2013 Vogtmeier ............ G01T 1/2008 250/366
2014/0159183 A1 6/2014 Na
2015/0123077 A1 * 5/2015 Cho ...................... H10F 77/413 257/21
2016/0254470 A1 * 9/2016 Forrest ................... H10K 30/20 136/244
2016/0343966 A1 * 11/2016 Forrest ................. H10K 30/211
2017/0005284 A1 * 1/2017 Che ........................ H10K 30/15
2017/0241836 A1 * 8/2017 Langner .................... G01J 3/36
2018/0158856 A1 * 6/2018 Han .................... H10F 39/8053
2018/0198005 A1 * 7/2018 Siegmund ......... H01L 31/02327
2018/0226529 A1 * 8/2018 Uzu ...................... H01L 31/028

FOREIGN PATENT DOCUMENTS

JP H04-237583 A 8/1992
JP H06-323900 A 11/1994
JP 2007-158338 A 6/2007
JP 2014-045015 A 3/2014
JP 2018-525831 A 9/2018
WO 2017/029223 A1 2/2017

OTHER PUBLICATIONS

Wang et al., Monolithically Integrated, Resonant-Cavity-Enhanced Dual-Band Mid-Infrared Photodetector on Silicon, Applied Physics Letters, A I P Publishing LLC, US, vol. 100 No. 21, May 21, 2012, pp. 211106-1-211106-3.
International Search Report (and English translation) and Written Opinion of the International Searching Authority for International Application No. PCT/EP2020/063660 mailed on Sep. 8, 2020.
Zynek, J., "Photodiode with resonant cavity based on InGaAs/InP for 1.9 µm band.", Opto-Electronics Review, 12, 2004, 1, 149-155.
An, K. H., "Organic Photodetector with spectral response tunable across the visible spectrum by means on internal optical microcavity." Organic Electronics, 10, 2009, 1152-1157.
Wang, Wei et al., "A novel resonant cavity photodetector with dual-absorption structure", Asia Communications and Photonics Conference and Exhibition, Dec. 2010, DOI: IO.I 109/ACP.2010. 5682787.

* cited by examiner

PHOTODETECTOR WITH IMPROVED DETECTION RESULT

CROSS REFERENCE TO RELATED APPLICATIONS

This application is a national stage filing under section 371 of International Application No. PCT/EP2020/063660 filed on May 15, 2020, and published on Nov. 26, 2020 as WO 2020/234171, which claims priority to German Application No. 10 2019 113 343.2, filed on May 20, 2019. The entire contents of WO 2020/234171 are hereby incorporated herein by reference.

The invention relates to a photodetector for detecting electromagnetic radiation in a spectrally selective manner, which comprises an optoelectronic component having an optical cavity and at least one detection cell arranged therein and enables an improved detection result.

Photodetectors for detecting electromagnetic radiation in a spectrally selective manner are used for the qualitative and quantitative detection of electromagnetic radiation, hereinafter also referred to as light, of a specific wavelength in an incident radiation. The incident radiation is a broadband radiation that contains light of many different wavelengths. Such photodetectors often have filters or an optical cavity, which allows only specific wavelengths of the incident radiation to resonate within the cavity. In this case, the optical cavity is formed by mirrors, of which at least one is semi-transparent, and which are arranged at a distance L from one another. Within the optical cavity, the radiations (electromagnetic waves) of the resonance wavelengths are reflected several times between the mirrors and amplified and pass through a photoactive layer that converts the electromagnetic radiation into electrical power. Such a photodetector is described, for example, in WO 017/029223 A1. Each of the resonant waves has a natural number of oscillation maxima within the optical cavity and is called a resonant wave of the ith order, where i corresponds to the number of oscillation maxima. All generated resonant waves of 1st to nth order contribute to the electrical signal of the photodetector. Thus, a detection of a specific wavelength of the resonant waves is only possible in a limited range for the wavelength to be detected or with great external effort, e.g., by upstream filters or a complex evaluation of the measured electrical signal.

Another essential factor for the accuracy of the detection of a specific wavelength in the optical cavity is the width of the wavelength range amplified by the optical cavity. Although single resonance wavelengths were mentioned above, where ideally only these single resonance wavelengths form standing waves, in reality a certain wavelength range around each of the single resonance wavelengths is amplified in the optical cavity and forms standing waves. The amplification of the optical cavity, which determines the external quantum efficiency (EQE) for a given wavelength, is approximately a sequence of super-Gaussian distributions or Lorentz distributions, each with a maximum value at a resonance wavelength. Spectrally plotted, i.e. in the representation of the magnitude of the amplification of the photodetector over the wavelength, the resonance wavelengths are discernible as peaks. The width of the wavelength range in which the peak lies and at whose range limits the amplification has reached half of the maximum is referred to as peak width. The larger the peak width, the less accurate the detection, since wavelengths within the amplified wavelength range can no longer be distinguished from each other. This is described by the cavity quality factor Q, which is approximately calculated as the quotient of the peak wavelength and the peak width.

The object of the present application is to provide a photodetector for detection of electromagnetic radiation in a spectrally selective manner with an optical cavity, which enables improved detection. Furthermore, a space-saving structure of a photodetector for the detection of electromagnetic radiation of several different wavelengths is to be provided, which allows for miniaturization of the detectors or spectrometers.

The object is achieved by a photodetector according to one of the independent claims. Advantageous implementations and embodiments are given in the dependent claims.

According to a first aspect of the invention, a photodetector for detecting electromagnetic radiation in a spectrally selective manner contains a first optoelectronic component for detecting a first wavelength of the electromagnetic radiation. Thereby, the mere presence or absence of the first wavelength in the electromagnetic radiation incident on the photodetector (qualitative statement) and/or the intensity of the radiation of the first wavelength in the incident electromagnetic radiation (quantitative statement) can be detected. The first optoelectronic component includes a first optical cavity and at least one detection cell arranged in the first optical cavity. The first optical cavity is formed by two mutually spaced parallel mirror layers. For all optical cavities of the present application, the distance between the two mirror layers is referred to as the physical length of the optical cavity, hereinafter also referred to as the length of the optical cavity for short. The length of the first optical cavity is designed in such a way that an ith-order resonant wave associated with the first wavelength is formed in the first optical cavity. In general, the following relationship applies to the ratio of a wavelength of the incident radiation that satisfies the resonance criterion and the physical length of the optical cavity:

$$L = i \cdot \frac{\lambda_i \cdot \cos\alpha}{2n}, \tag{1}$$

where L is the physical length of the optical cavity, $\lambda_i$ is the incident wavelength, $\alpha$ is the angle of incidence of the incident radiation with respect to the normal to the surface of the optoelectronic component on which the incident radiation impinges, n is the effective refractive index over the entire optical cavity and any other layers in between, and i is the order of the resonant wave resulting from the incident wavelength. Here, i is a natural number. Corresponding to the order i of the resonant wave associated with the first wavelength, the optoelectronic component is also referred to as an ith-order component.

Whenever "the resonant wave" is referred to in the following description, the resonant wave belonging to the wavelength to be detected in the respective optoelectronic component is meant in each case, unless explicitly stated otherwise.

Each detection cell arranged in the first optical cavity contains a photoactive layer. The photoactive layer preferably extends over the entire cross-sectional area of the first optical cavity, the cross-sectional area being perpendicular to the length of the first optical cavity. Thereby, the photoactive layer of a detection cell is arranged within the first optical cavity in each case in such a way that precisely one oscillation maximum of the resonant wave lies within the photoactive layer. In other words, depending on the order of the resonant wave generated by the first wavelength to be detected, the photoactive layer is arranged within the optical cavity. Preferably, the location of the oscillation maximum, i.e. the location of the intensity maximum of the electromagnetic field of the resonant wave, is thereby located as centrally as possible in the photoactive layer with respect to the thickness of the photoactive layer measured in the direction of the length of the first optical cavity. The thickness of the photoactive layer is preferably such that a node of the resonant wave adjacent to the oscillation maximum located in the photoactive layer is no longer located in the photoactive layer.

According to the invention, the order of the resonant wave of the first optoelectronic component is greater than 1. In other words: A first wavelength forming a resonant wave of 2nd, 3rd, 4th or higher order in the first optical cavity is detected in the first optoelectronic component, since the photoactive layer is arranged in exactly one oscillation maximum of this resonant wave.

Since higher order resonant waves have significantly smaller peak widths than first order resonant waves detected in the prior art, finer discrimination of different wavelengths, i.e., better spectral resolution of the photodetector, can be achieved.

Preferably, at least one of the detection cells has a first charge transport layer and a second charge transport layer, with the photoactive layer arranged between the first and second charge transport layers. The individual layers are arranged one above the other along the length of the first optical cavity. The first and second charge transport layers likewise preferably extend along the entire cross-sectional area of the first optical cavity, with the first charge transport layer adjacent a first surface of the photoactive layer and the second charge transport layer adjacent a second surface of the photoactive layer, with the second surface opposite the first surface. The charge transport layers serve to improve the extraction of charge from the photoactive layer and its conduction towards electrical contacts, also called electrodes, which transmit the electrical signals generated in the detection cell to an evaluation unit suitable for evaluating them. These charge transport layers are particularly advantageous for very thin photoactive layers with thicknesses less than 10 nm, and are then formed with a thickness greater than or equal to 10 nm. In the case of thicker photoactive layers, the charge transport layers can also be formed only very thinly, for example with a thickness in the range from 1 nm to 5 nm, with which they can also be referred to as injection or extraction layers. In both cases, the charge transport layers do not necessarily have to be doped layers.

The mirror layers can be formed as highly reflective metallic layers, e.g. of silver (Ag) or gold (Au), semitransparent mixed metal layers, e.g. of Ag:Ca, or as dielectric mirrors (DBR—distributed Bragg reflector). At least one of the mirror layers is semi-transparent to allow incident light into the optical cavity, while the other mirror layer can be opaque. This property can be adjusted, for example, via the thickness of the mirror layer and/or the materials and mixing ratios of the components of the mirror layers, which is known to those skilled in the art. If the mirror layers consist of a material with good electrical conductivity, such as a conductive oxide, a conductive organic compound or a metal, the mirror layers can serve as electrodes for forwarding the electrical signals generated in the detection cell to an evaluation unit suitable for evaluating them. The evaluation unit is not necessarily part of the photodetector, but may be rigidly connected to it and formed on or in the same substrate on which the photodetector is formed. In the case of a dielectric mirror, a thin layer of an electrically well-conducting material, e.g., a thin metal layer, may be arranged on the last dielectric layer of the mirror layer facing the detection cell, so that also in this case the mirror layer may serve as an electrode. Further possibilities of electrical contacting of the detection cells will be explained later.

The following materials can be taken into consideration for photoactive layers, especially for the detection of wavelengths in the near infrared range (NIR) with 800 nm≤$\lambda_i$≤10 μm: fullerenes, e.g. C60 or C70, mixed with donors such as materials from the phthalocyanine group (such as zinc phthalocyanine or iron phthalocyanine), pyrans, e.g. bis-pyranilides (abbreviated TPDP), fulvalenes, e.g. tetrathiofulvalenes (abbreviated OMTTF), as well as aromatic amines (e.g. N,N,N',N'-tetrakis(4-methoxyphenyl)-benzidines (abbreviated as MeO-TPD), 2,7-bis[N,N-bis(4-methoxyphenyl)amino]9,9-spiro-bifluorenes (abbreviated as Spiro-MeO-TPD) or 4,4',4"-tris(3-methylphenyl-phenylamino)triphenylamine (abbreviated as m-MTDATA)), bisthiopyranilidene, bipyridinylidene, or diketopyrrolopyrrole. Möglich wären auch Stoffe wie HatCN:BFDPB, HATCN:4P-TPD, HATCN:a-NPB. Of course, any other photoactive materials can also be used, for example polymers produced by liquid processing, such as those from the polythiophene group (e.g. poly(2,5-bis(3-alkylthiophene-2-yl)thieno[3,2-b]thiophenes (abbreviated as pBTTT)).

In each case, a photoactive layer preferably has a thickness that is in the range of 0.1 nm to 1 μm, with the thickness of the photoactive layer depending on both the material of the photoactive layer and the overall structure of the optoelectronic component. Particularly preferably, the thickness of the photoactive layer for charge transfer photodiodes (CTPD) using the direct interchromophoric charge transfer state, with e.g. C60:TPDP, is in the range of 10 nm to 1000 nm, while for photodiodes using direct material absorption and separating the charge carriers in bulk or flat heterojunctions (BHJ, FHJ), e.g. C60:ZnPc, it is in the range of 0.1 nm to 100 nm.

As charge transport layers, for example, aromatic amines (such as N,N,N',N'-tetrakis(4-methoxyphenyl)-benzidines (abbreviated also to MeO-TPD), 2,7-bis[N,N-bis(4-methoxy-phenyl)amino]9,9-spiro-bifluorenes (abbreviated also to spiro-MeO-TPD) or N4,N4'-bis(9, 9-dimethyl-9H-fluoren-2-yl)-N4,N4'-diphenylbiphenyl-4,4'-diamines (abbreviated as BF-DPB) or 9,9-bis[4-(N,N-bis-biphenyl-4-yl-amino)phenyl]-9H-fluorenes (abbreviated as BPAPF)) or polymers such as Po-3,4-ethylenedioxythiophene poly(styrenesulfonate (abbreviated as PEDOT:PSS), SpiroTTB, NDP9, F6-TCNNQ, C60F48, BPhen, C60, HatnaCl6, MH250, W2(hpp)4, Cr2(hpp)4, NDN26 can be used. Of course, other suitable materials or a combination of at least two of the named materials can also be utilized. In this case, the material of the first charge transport layer differs from the material of the second charge transport layer of a detection cell in that one material is an electron-conducting material and the other is a hole-conducting material. The material of the charge transport layers can be a doped material, but need not be.

The electrical conductivity of the charge transport layers is preferably in the range of greater than $10^{-5}$ S/cm. The thickness of the charge transport layers is preferably in the range of 1 nm to 100 nm, with the thickness generally decreasing as the number of detection cells in the first optical cavity increases. Furthermore, the thickness of the first charge transport layer of a detection cell may be different from the thickness of the second charge transport layer of that detection cell.

If different detection cells are present in the first optical cavity, the photoactive layers and, if present, the first charge transport layers and the second charge transport layers of the different detection cells may differ from each other in terms of material and thickness.

In any case, of course, the sum of the thicknesses of all layers present in the first optical cavity, i.e. photoactive layer or layers, charge transport layers if any, and/or other layers, is equal to the length of the first optical cavity.

In one embodiment, the number of detection cells arranged in the first optical cavity corresponds to the order of the resonant wave. That is, the first optoelectronic component contains exactly two detection cells whose photoactive layers are each arranged in exactly one and mutually different oscillation maximum of the resonant wave if the first wavelength associated with the 2nd order resonant wave is to be detected; contains exactly three detection cells if the first wavelength associated with the 3rd order resonant wave is to be detected, and so on. The detection cells are each arranged one above the other along the length of the first optical cavity, but do not have to be adjacent to one another.

Alternatively, a smaller number of detection cells than the order of the resonant wave can be arranged in the first optical cavity. For example, a detection cell whose photoactive layer is arranged within the optical cavity in such a way that exactly one oscillation maximum of the resonant wave lies therein is sufficient in principle for the detection of a resonant wave of second, third or higher order. This simplifies the manufacture of the photodetector and reduces the manufacturing costs by using simple and inexpensive materials instead of the non-formed detection cells.

Preferably, at least one optically absorbing intermediate layer is arranged in the first optical cavity such that exactly one oscillation node of the resonant wave is located in the optically absorbing intermediate layer. For optoelectronic components designed to detect resonant waves of higher order than 2nd order, preferably a plurality of optically absorbing intermediate layers are arranged such that each oscillation node of the resonant wave lies in exactly one optically absorbing intermediate layer. The at least one optically absorbing intermediate layer serves to absorb resonant waves of a different order than that of the resonant wave associated with the first wavelength. In particular, resonant waves adjacent to the resonant wave associated with the first wavelength are cancelled in the nodes, while the resonant wave associated with the first wavelength is hardly affected. Thus, the assignment of a detected electrical signal to the first wavelength can be ensured for a larger range of the first wavelength and the application possibilities of such a photodetector can be extended.

In some embodiments, at least one of the optically absorbing intermediate layers is directly adjacent to a detection cell, i.e. to the photoactive layer or to one of the charge transport layers, if present, of this detection cell, and is composed of an electrically conductive material. It is further suitable for being electrically conductively connected to an evaluation unit suitable for evaluating the electrical signals generated by the at least one detection cell of the first optoelectronic component. Such an intermediate layer thus serves as an electrical contact for tapping the electrical signals from the detection cell, even if the photoactive layer or a corresponding charge transport layer, if present, of the relevant detection cell is not directly adjacent to an electrically conductive mirror layer.

In further embodiments, at least one optically transparent contact layer is arranged in the first optical cavity, which contact layer is directly adjacent to a detection cell, i.e. to the photoactive layer or, if present, to one of the charge transport layers of this detection cell, and is composed of an electrically conductive material. This contact layer is suitable for being electrically conductively connected to an evaluation unit suitable for evaluating the electrical signals generated by the at least one detection cell of the first optoelectronic component. It thus serves as an electrical contact for tapping the electrical signals from the detection cell, even if the photoactive layer or a corresponding charge transport layer, if present, of the relevant detection cell is not directly adjacent to an electrically conductive mirror layer or an electrically conductive intermediate layer. In particular, it is optically transparent for the resonance wavelength associated with the first wavelength.

As materials for an optically absorbing interlayer, layers of organic small molecules, organic mixed layers or polymers, e.g. highly doped hole-conducting materials such as MeO-TPD:F6TCNNQ or PEDOT:PSS with quantum dots (QD), can be used. If the optically absorbing intermediate layer is to be electrically conductive, metals, such as Ag, or metal mixtures, such as Ag:Ca, or conductive oxides, such as indium tin oxide (ITO) or zinc oxide (ZnO) or aluminum-doped zinc oxide (AZO) can also be used. An optically transparent contact layer can also be made of the same materials. The optical and electrical properties of such an intermediate or contact layer can be adjusted by the thickness and the mixture of the materials. For metals, the thickness of the layers is preferably in the range from 0.1 nm to 40 nm, more preferably in the range from 5 nm to 10 nm, while for polymers or oxides it is in the range from 20 nm to 100 nm, more preferably in the range from 30 nm to 60 nm, with small thicknesses in each case being associated with greater optical transparency.

An optically absorbing layer within the scope of this application, which is applied as an optically absorbing intermediate layer, is understood to be a layer which is suitable for absorbing so much energy of a specific electromagnetic wave that it is extinguished. Such a specific electromagnetic wave has a wavelength different from the resonance wavelength associated with the first wavelength. For this purpose, the material of the optically absorbing layer may be absorbing only for wavelengths different from the resonance wavelength associated with the first wavelength, while being non-absorbing for the resonance wavelength associated with the first wavelength. However, such specific wavelength dependence of the absorption coefficient is not given for most materials to a sufficient extent for adjacent resonance wavelengths, whereby a selection of the absorbed wavelengths is also carried out by the spatial arrangement of the absorbing layer within the optical cavity, as previously described. Since it is generally true that the absorption coefficient for an electromagnetic wave depends on the product of the absorption coefficient k of the material at the specific wavelength of the electromagnetic wave and the thickness d of the layer, as well as the energy E of the electromagnetic wave in the region of the layer, this product has, according to the invention, a value greater than or equal to $1 \cdot E$ ($k \cdot d \cdot E \geq 1 \cdot E$) for a wavelength not corresponding to the resonance wavelength associated with the first wavelength. Thus, a layer of a material with a very high absorption coefficient k can be made very thin, while a layer of a material with a comparatively low absorption coefficient k must be made correspondingly thicker in order to achieve the cancellation of a specific electromagnetic wave. In contrast, within the scope of this application, an optically transparent layer, used for example as a spacer layer or as an optically transparent contact layer, is understood to be a layer which absorbs as little energy as possible of a specific electromagnetic wave and thus influences this wave hardly at all or at least less than the photoactive layer. Here, the specific electromagnetic wave is the one that has the resonance wavelength associated with the first wavelength. For this purpose, the product of the absorption coefficient k of the material at the wavelength of the specific electromagnetic wave and the thickness d of the layer and the energy E of the specific electromagnetic wave in the region of the layer has a value of less than 1 ($k \cdot d \cdot E < 1 \cdot E$). Thus, a layer made of a material with a very small absorption coefficient k can be designed to be relatively thick, while a layer made of a material with a comparatively higher absorption coefficient k must be designed to be correspondingly thinner in order to keep the influence on a specific electromagnetic wave low. Typical absorption coefficients for metals, for example, are in the range of greater than 0.5, while typical materials for the photoactive layers have absorption coefficients of less than 0.01. Typical materials for charge transport layers have absorption coefficients of less than 0.1.

If the electrical contact of the detection cell to the evaluation unit is established via such an intermediate layer or contact layer, the mirror layer, which is then no longer required for electrical contact, can be optimized in terms of its optical, i.e. reflective or semitransparent, properties. By decoupling the optical and electrical elements of the optoelectronic component, it is possible to improve the detection result by improving the optical properties of the mirror layers.

In other embodiments, the first optoelectronic component has at least one external contact which is adjacent to an outer surface of a detection cell, that is, to an outer surface of the photoactive layer or one of the charge transport layers, if present, and is made of an electrically conductive material. This outer contact is suitable to be electrically conductively connected to an evaluation unit suitable to evaluate the electrical signals generated by the at least one detection cell of the first optoelectronic component. Such an external contact thus serves as an electrical contact for tapping the electrical signals from said detection cell, even if the photoactive layer or a charge transport layer, if present, of this detection cell is not directly adjacent to an electrically conductive mirror layer or an electrically conductive intermediate layer or contact layer. In particular, metals such as Ag or Au are used as materials for such an external contact.

Preferably, the first optoelectronic component has at least two such external contacts arranged on opposite sides of the detection cell. The opposite sides are corresponding sides of the detection cell that are spaced from each other along the length of the optical cavity, for example, a first side of the photoactive layer facing the first mirror layer and a second side of the photoactive layer facing the second mirror layer, or the first charge transport layer and the second charge transport layer. Of course, in each case, there must be electrical separation of the two external contacts from each other. Thus, outer contacts directly adjacent to the photoactive layer are more applicable for thick photoactive layers and not for very thin photoactive layers. Since in the embodiment with two external contacts in one detection cell no additional electrically conducting layers, which could optically influence the resonant wave, are present in the detection cell and at the same time the electrical contacting of the detection cell is decoupled from the mirror layers, the layers present in the optical cavity can be optimized for their optical properties. Thus, a further improvement of the detection result is possible via the improvement of the cavity quality.

In an optoelectronic component, a choice of the electrical contacting options described above may also be used in one detection cell or for different detection cells.

In embodiments of the photodetector, at least one optically transparent spacer layer is arranged in the first optical cavity, the spacer layer being arranged between one of the mirror layers and a detection cell adjacent to this mirror layer. The optically transparent spacer layer is a layer that hardly influences at least the standing wave with the resonance wavelength associated with the first wavelength, as described above. The material and thickness of the spacer layer are selected according to the conditions described above, and the thickness also depends on the thicknesses of the other layers present in the optical cavity and the length of the optical cavity.

In embodiments of the photodetector according to the invention, if two or more detection cells are arranged in the first optical cavity, an optically transparent spacer layer of the type described above is arranged between two detection cells arranged one above the other in the first optical cavity along the length of the first optical cavity.

The optically transparent spacer layers are preferably electrically non-conductive, i.e. electrically insulating, and preferably consist of transparent oxides, such as $Al_2O_3$, $SiO_2$, $TiO_2$ or organic compounds, such as those used for the charge transport layers. These layers preferably have a charge carrier mobility of less than $10^{-6}$ $cm^2/Vs$ and thus only a very low electrical conductivity. In this case, the electrical contact of the charge transport layer of a detection cell adjacent to the spacer layer to the evaluation unit is established via an electrically conductive intermediate layer or contact layer or an external contact as described above. The mirror layer, which is then no longer required for electrical contact, as well as the other layers within the optical cavity can thus be optimized independently of one another in terms of their optical or electrical properties. By decoupling the optical and electrical elements of the photodetector, an improvement of the detection result is possible.

In embodiments, the photodetector contains a second optoelectronic component for detecting a second wavelength of electromagnetic radiation. Similar to the first optoelectronic component, the second optoelectronic component includes a second optical cavity and at least one detection cell arranged in the second optical cavity. The second optical cavity is also formed by two mutually spaced parallel mirror layers, the length of the second optical cavity being such that, for the second wavelength, a jth-order resonant wave associated therewith is formed in the second optical cavity. Each detection cell of the second optoelectronic component contains a photoactive layer. In each case, the photoactive layer is arranged within the second optical cavity in such a way that a oscillation maximum of the resonant wave lies within the photoactive layer. In such a photodetector, the length of the first optical cavity differs from the length of the second optical cavity and/or the order of the resonant wave associated with the second wavelength differs from the order of the resonant wave associated with the first wavelength. In this context, the order of the resonant wave of the second optoelectronic component may also be the 1st order. Preferably, at least one detection cell of the second optoelectronic component also comprises a first charge transport layer and a second charge transport layer, between which the photoactive layer is arranged. That is, said layers are arranged one above the other, i.e. adjacent to each other, along the length of the second optical cavity.

In such a photodetector, the first and second optoelectronic components may be arranged side by side along a direction perpendicular to the length of the first and second optical cavities. This arrangement is also referred to as a lateral arrangement. They may be spaced apart and physically separated from each other, so that each optoelectronic component is individually (separately) connectable to an evaluation unit. The first and second optoelectronic components can also be arranged adjacent to each other, in which case, however, electrical separation of the charge transport layers, if present, and/or of the layers carrying the electrical signals to the outside, such as mirror layers, intermediate layers or contact layers, of the optoelectronic components, i.e. pixelation of these layers, is necessary. A given lateral arrangement of different optoelectronic components can also be arranged one or more times recurrently along a direction perpendicular to the length of the optical cavities side by side, i.e. laterally adjacent. Thus, an image-forming system, a so-called imager system, can be realized.

In other embodiments of a dual optoelectronic component photodetector, the first and second optoelectronic components are arranged one above the other such that the lengths of the first optical cavity and the second optical cavity extend along a common line. This arrangement is also referred to as a vertical arrangement. Here, the first and second optical cavities are connected by a semi-transparent mirror layer, that is, the first optical cavity and the second optical cavity share this semi-transparent mirror layer, which serves as a mirror in each of the two optoelectronic components. With this structure, which resembles a stacking of optoelectronic components, the active area of the photodetector can be reduced, on the one hand. On the other hand, this setup enables a photodetector that responds selectively to certain angles of incidence of the incident electromagnetic radiation, in which an optoelectronic component with a large length of optical cavity detects a defined wavelength or a defined wavelength range in the incident radiation at large angles of incidence, while an optoelectronic component with a smaller optical cavity length detects the same defined wavelength or wavelength range in the incident radiation at small angles of incidence, if both optoelectronic components are components of the same order. Of course, the angle-dependent different response of the two optoelectronic components can be achieved not or not only via the length of the optical cavity, but also or additionally via different orders of the optoelectronic components.

A photodetector for detecting electromagnetic radiation in a spectrally selective manner according to a second aspect of the invention contains a first optoelectronic component for detecting a first wavelength of the electromagnetic radiation. In this regard, the mere presence or absence of the first wavelength in the electromagnetic radiation incident on the photodetector (qualitative statement) and/or the intensity of the radiation of the first wavelength in the incident electromagnetic radiation (quantitative statement) may be detected. The first optoelectronic component includes a first optical cavity, a detection cell disposed in the first optical cavity, and at least one optically transparent spacer layer. The first optical cavity is formed by two mutually spaced parallel mirror layers, the length of the first optical cavity being such that, for the first wavelength, an ith-order resonant wave associated therewith is formed in the first optical cavity. The formula (1) already given above applies, where i can be greater than or equal to 1.

The detection cell arranged in the first optical cavity contains a photoactive layer which preferably extends over the entire cross-sectional area of the first optical cavity, the cross-sectional area being perpendicular to the length of the first optical cavity. Thereby, the photoactive layer of the detection cell is arranged within the first optical cavity such that the oscillation maximum of the resonant wave is located within the photoactive layer. Thus, the photoactive layer is preferably arranged centrally in the first optical cavity with respect to its length.

Preferably, the detection cell further comprises a first charge transport layer and a second charge transport layer, the photoactive layer being disposed between the first and second charge transport layers. The individual layers are arranged one above the other along the length of the first optical cavity. Also the first and second charge transport layers preferably extend along the entire cross-sectional area of the first optical cavity, with the first charge transport layer adjacent a first surface of the photoactive layer and the second charge transport layer adjacent a second surface of the photoactive layer, with the second surface opposite the first surface. The charge transport layers serve to improve the extraction of charge from the photoactive layer and its conduction towards electrical contacts, also called electrodes, which transmit the electrical signals generated in the detection cell to an evaluation unit suitable for evaluating them. These charge transport layers can be very thin, which means that they can also be referred to as injection or extraction layers. They do not always have to be doped layers.

The at least one optically transparent spacer layer is arranged between one of the mirror layers and the detection cell, i.e. between said mirror layer and the photoactive layer or between said mirror layer and the charge transport layer of the detection cell adjacent to said mirror layer. The optically transparent spacer layer is formed as set forth above with respect to its optical properties and is furthermore electrically insulating. This means that an electrical signal from the photoactive layer or the corresponding charge transport layer cannot be read out via the corresponding adjacent mirror layer, i.e. fed to an evaluation unit.

According to the invention, the first optoelectronic component of the photodetector according to the second aspect therefore comprises at least one outer contact which is adjacent to an outer surface of the detection cell, i.e. the photoactive layer or the charge transport layer—if present—which is separated from the adjacent mirror layer by the at least one spacer layer. The outer contact is made of an electrically conductive material, as already described with respect to the photodetector according to the first aspect, and is adapted to be connected to an evaluation unit in an electrically conductive manner, the evaluation unit being adapted to evaluate the electrical signals generated by the detection cell of the first optoelectronic component.

Since an electrically conductive contact layer extending over large regions of the cross-sectional area of the first optical cavity is dispensed with and the electrical contact is instead relocated to the outer surface of the detection cell, the optical propagation of the resonant wave in the optical cavity is less disturbed, thus improving the cavity quality of the first optical cavity. In addition, the layers arranged in the optical path of the resonant wave can be optimized with respect to their materials for their optical properties. All of this contributes to the improvement of the detection result.

In a preferred embodiment of the photodetector according to the second aspect, an optically transparent spacer layer, as already described, is arranged between each of the mirror layers and the detection cell, i.e., between the respective mirror layer and the photoactive layer or the charge transport layer of the detection cell adjacent to this mirror layer, and the first optoelectronic component has at least two external contacts, in each case one external contact being adjacent to the outer surface of the detection cell on a first side and to the outer surface of the detection cell on a second side. Here, the first side and the second side of the detection cell are opposite each other along the length of the first optical cavity. Thus, each outer contact is adjacent to either the outer surface of the photoactive layer on a first or second side of the detection cell or an outer surface of the first charge transport layer or the second charge transport layer, if present.

A photodetector for detecting electromagnetic radiation in a spectrally selective manner according to a third aspect of the invention contains a first optoelectronic component for detecting a first wavelength of electromagnetic radiation and a second optoelectronic component for detecting a second wavelength of electromagnetic radiation. Again, the mere presence or absence of the first wavelength or the second wavelength in the electromagnetic radiation incident on the photodetector (qualitative statement) and/or the intensity of the radiation of the first wavelength or the second wavelength in the incident electromagnetic radiation (quantitative statement) may be detected.

The first optoelectronic component comprises a first optical cavity and at least one detection cell arranged in the first optical cavity. The first optical cavity is formed by two mutually spaced parallel mirror layers, the length of the first optical cavity being such that, for the first wavelength, an ith-order resonant wave associated therewith is formed in the first optical cavity. The formula (1) already given above applies.

Each detection cell arranged in the first optical cavity contains a photoactive layer, as already explained with reference to the photodetector according to the first aspect. In this case, the photoactive layer of a detection cell is arranged in each case within the first optical cavity in such a way that exactly one oscillation maximum of the ith-order resonant wave is located within the photoactive layer. Again, this corresponds to the first optoelectronic component according to the first aspect. However, in contrast to the photodetector according to the first aspect, the resonant wave can also be a 1st order resonant wave, i.e. $i \geq 1$.

The second optoelectronic component has a second optical cavity and at least one detection cell arranged in the second optical cavity. The second optical cavity is formed by two mutually spaced parallel mirror layers, the length of the second optical cavity being such that a jth-order resonant wave associated with the first wavelength is formed in the first optical cavity. The formula (1) already given above applies, where i is replaced by j.

Each detection cell arranged in the second optical cavity contains a photoactive layer, as already explained with reference to the first optoelectronic component. In this case, the photoactive layer of a detection cell is arranged in each case within the second optical cavity in such a way that exactly one oscillation maximum of the jth-order resonant wave lies within the photoactive layer. This also corresponds to the structure of the first optoelectronic component. Here, too, the resonant wave can be a 1st-order or higher-order resonant wave.

Preferably, at least one detection cell of the first optical cavity and/or the second optical cavity further comprises a first charge transport layer and a second charge transport layer, as already explained with reference to the photodetector according to the first aspect.

According to the invention, the length of the second optical cavity differs from the length of the first optical cavity and/or the order of the resonant wave associated with the second wavelength differs from the order of the resonant wave associated with the first wavelength. In this regard, the resonant waves of both optoelectronic components may also be 1st-order resonant waves. Furthermore, according to the invention, the first and second optoelectronic components are arranged one above the other so that the lengths of the first and second optical cavities extend along a common line, wherein the first and second optical cavities are connected to each other by a semi-transparent mirror layer which is one of the mirror layers of the first optical cavity and the second optical cavity, respectively.

This setup, which resembles a stack of optoelectronic components, can be used to reduce the active area of the photodetector. On the other hand, this setup enables a photodetector selectively responding to certain angles of incidence of the incident electromagnetic radiation, in which an optoelectronic component with a large optical cavity length detects a defined wavelength in the incident radiation at large angles of incidence, while an optoelectronic component with a smaller optical cavity length detects the same defined wavelength in the incident radiation at small angles of incidence, if both optoelectronic components are components of the same order. Of course, the angle-dependent different response of the two optoelectronic components can be achieved not or not only via the length of the optical cavity, but also or additionally via different orders of the optoelectronic components.

The semi-transparent mirror layer associated with both optoelectronic components comprises one or more of the materials already mentioned in connection with the photodetector according to the first aspect, the thickness of the material being adjusted with respect to the reflection of the first or the second wavelength and the transparency of the other of the first or the second wavelength. When the semi-transparent mirror layer serves as an electrical contact for reading out the electrical signals generated in at least one of the optoelectronic components, the semi-transparent mirror layer is electrically conductive.

In embodiments, the number of detection cells arranged in the first optical cavity and/or in the second optical cavity corresponds to the order of the respective resonant wave.

In one or both of the optoelectronic components, as described with reference to the first optoelectronic component of the photodetector according to the first aspect, an optically transparent and electrically conductive contact layer or spacer layer may be disposed between one of the mirror layers and a detection cell adjacent to that mirror layer. If one of the optoelectronic components is a component with an order greater than 1, an optically transparent spacer layer may also be formed in each case between two detection cells arranged one above the other in the optical cavity of this optoelectronic component along the length of this optical cavity, or one or more optically absorbing intermediate layers may be formed.

Furthermore, at least one of the detection cells of the first optoelectronic component or of the second optoelectronic component can have at least one outer contact which is adjacent to an outer surface of the photoactive layer or of one of the charge transport layers, consists of an electrically conductive material and is suitable for being connected in an electrically conductive manner to an evaluation unit, the evaluation unit being suitable for evaluating the electrical signals generated by the detection cell. Here, too, the order of the resonant wave in the corresponding optoelectronic component is not important.

Of course, one or more additional optoelectronic components can also be stacked over the first and second optoelectronic components, with a semi-transparent mirror layer disposed between adjacent optoelectronic components in each case and belonging to both adjacent components.

The materials of the individual layers of the optoelectronic components of a photodetector according to the second or third aspect of the invention are similar to the materials mentioned with respect to the layers of the optoelectronic component of the photodetector according to the first aspect of the invention.

The photodetector according to any of the aspects of the invention may be formed on a substrate and surrounded by an enclosure or encapsulation as protection from environmental influences. However, at least the substrate or enclosure must be transparent to the incident electromagnetic radiation to allow it to impinge on the photodetector.

Within the scope of the invention, the embodiments or individual features may be combined to form the optoelectronic components and the photodetector, as long as they are not mutually exclusive.

In the following, the invention shall be clarified by means of exemplary implementations and figures. The dimensions of the individual elements and their relationship to one another are not to scale, but are only shown schematically. Identical reference signs designate corresponding components of the same type.

Figure 1A:
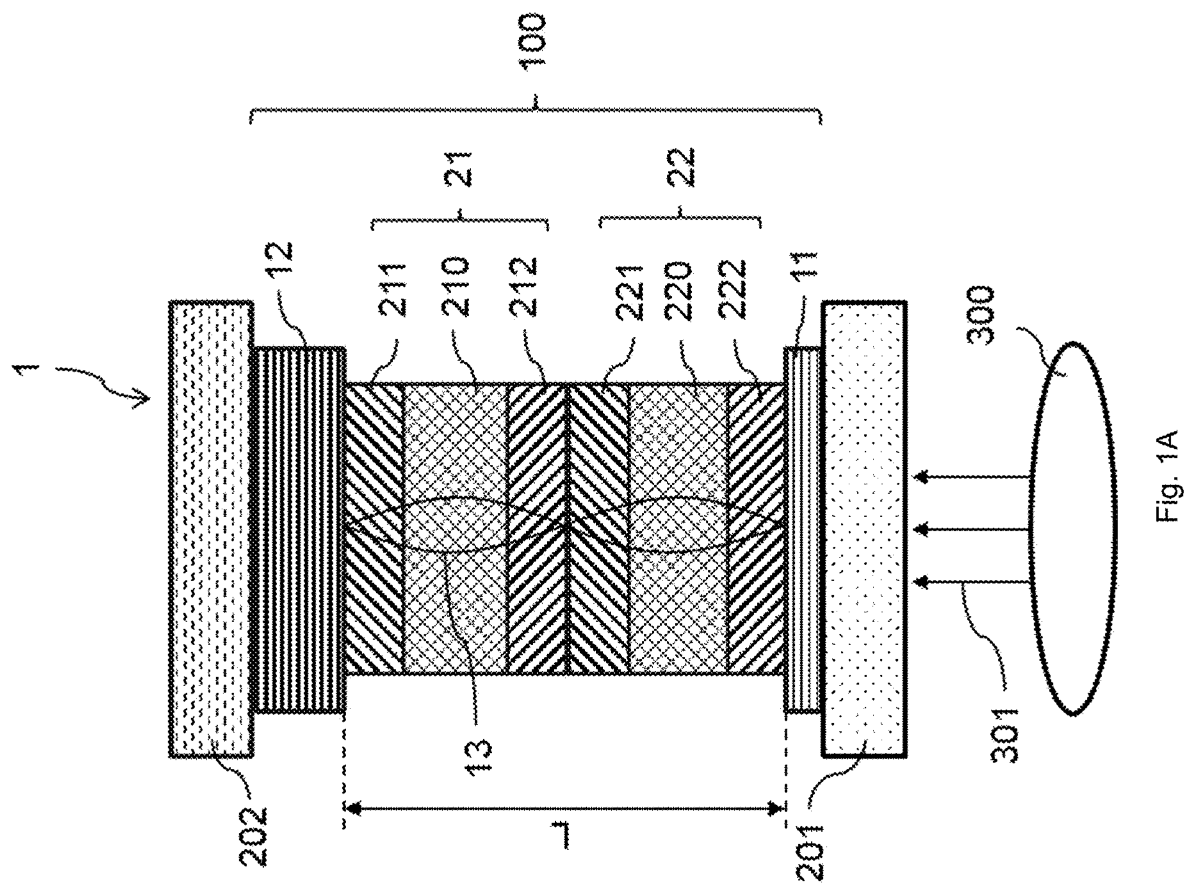
Figure 2:
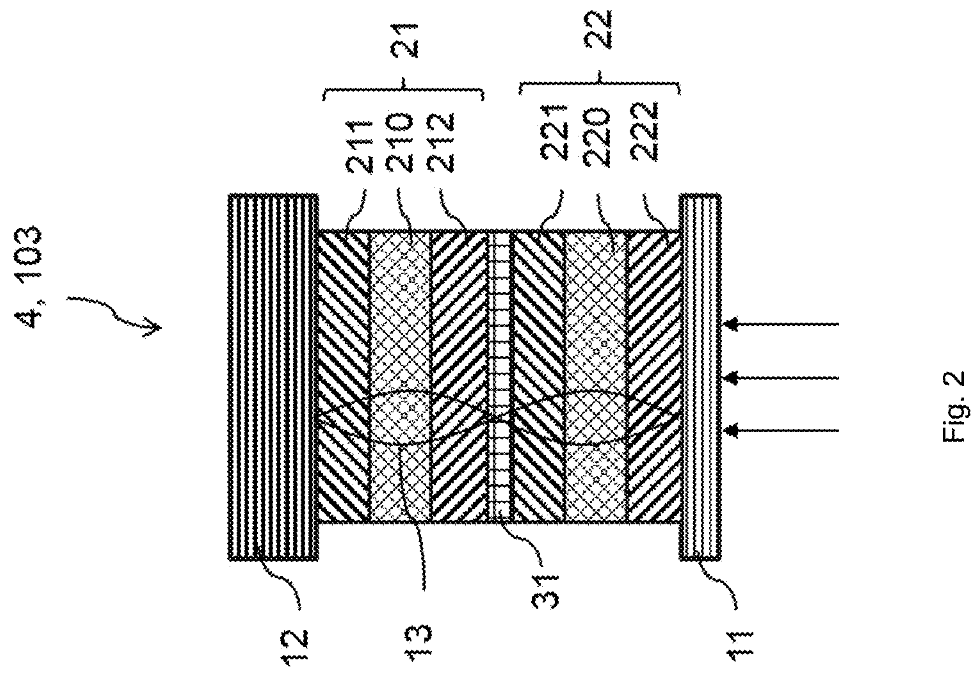
Figure 1C:
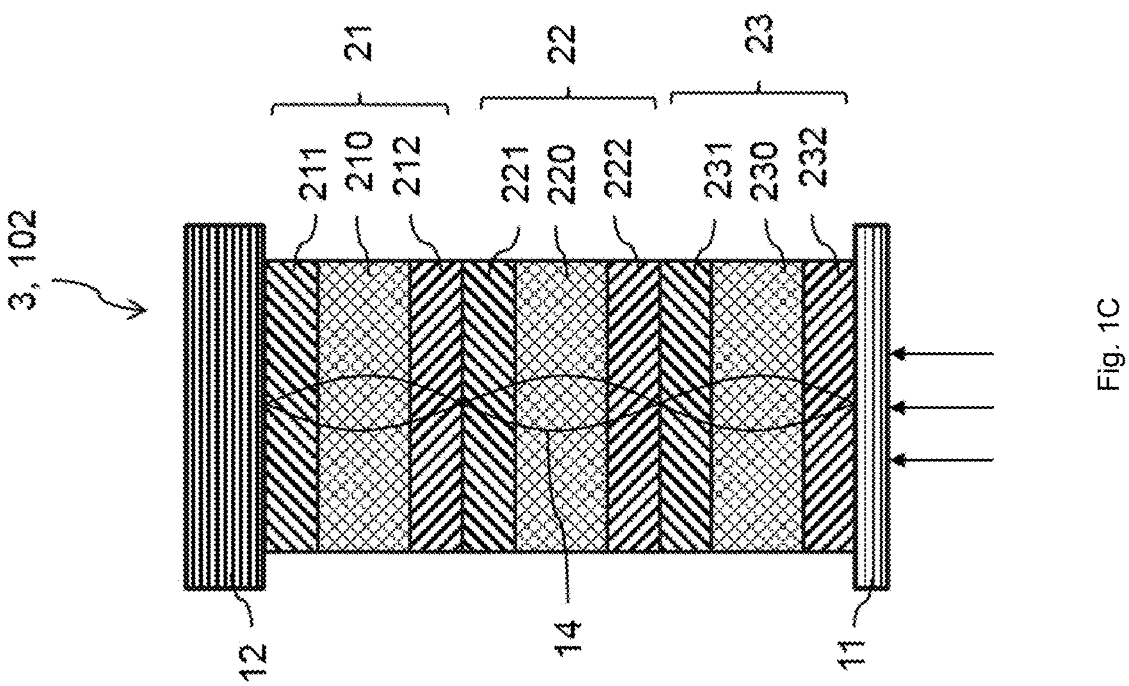
Figure 3:
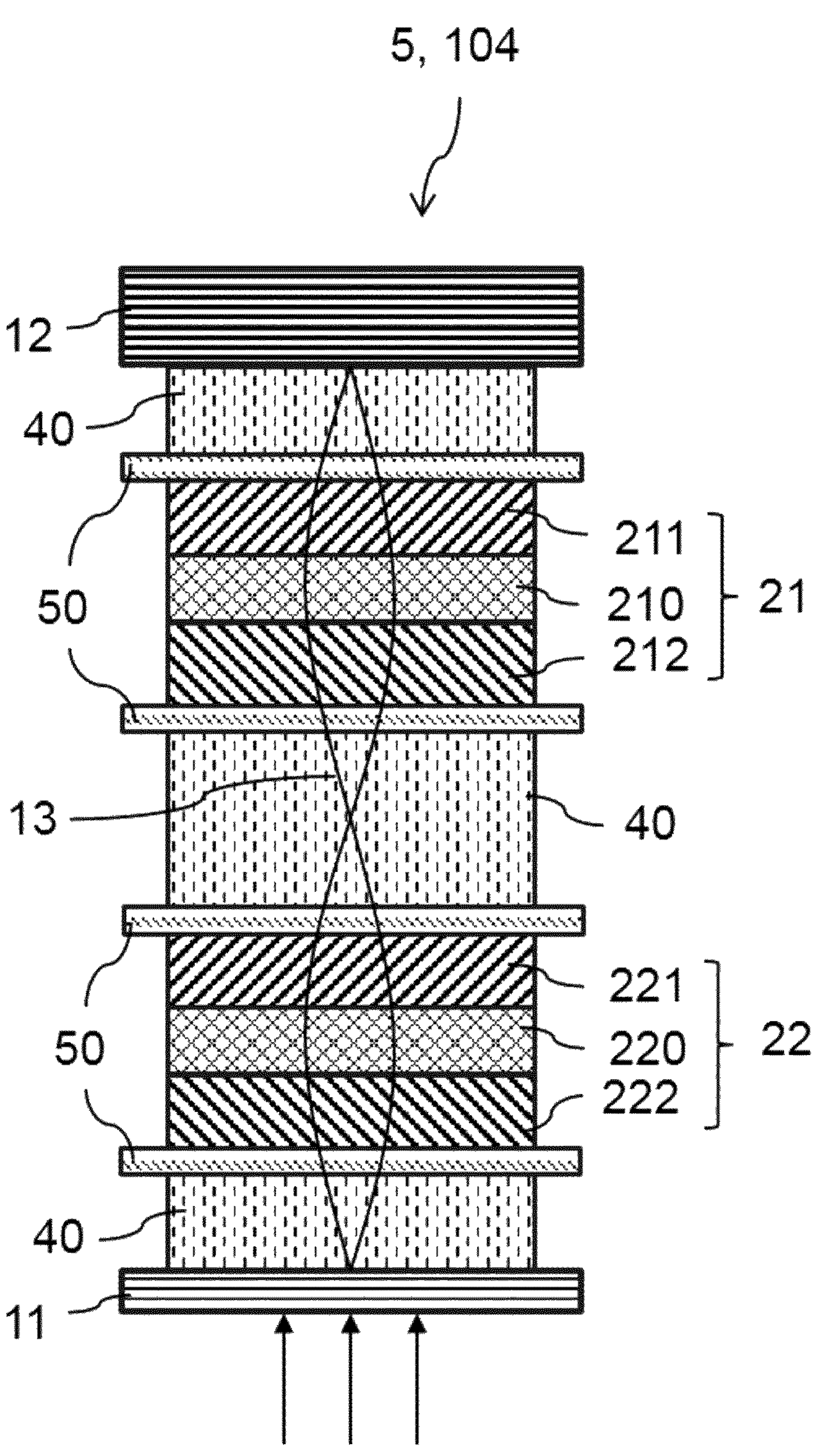
Figure 4B:
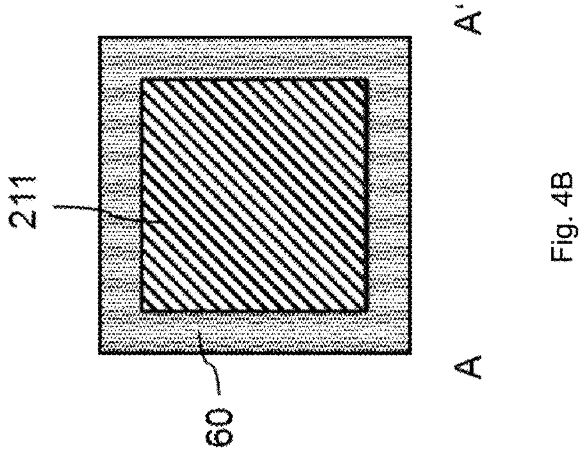
Figure 4A:
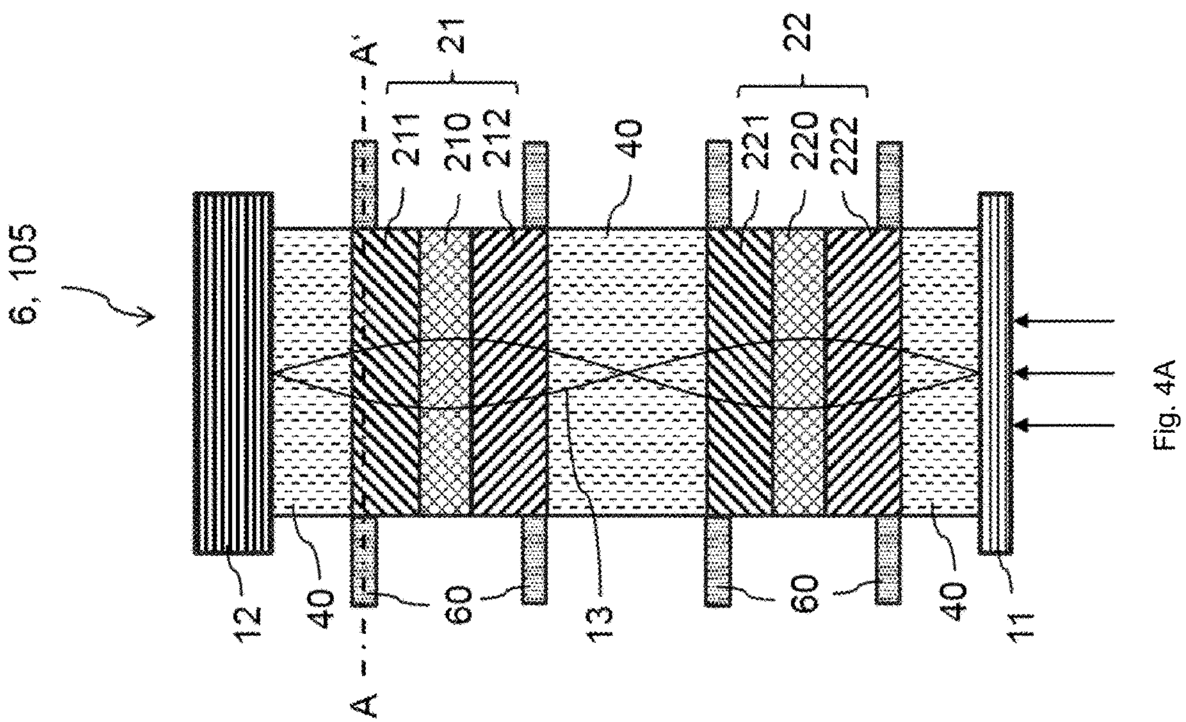
Figure 5A:
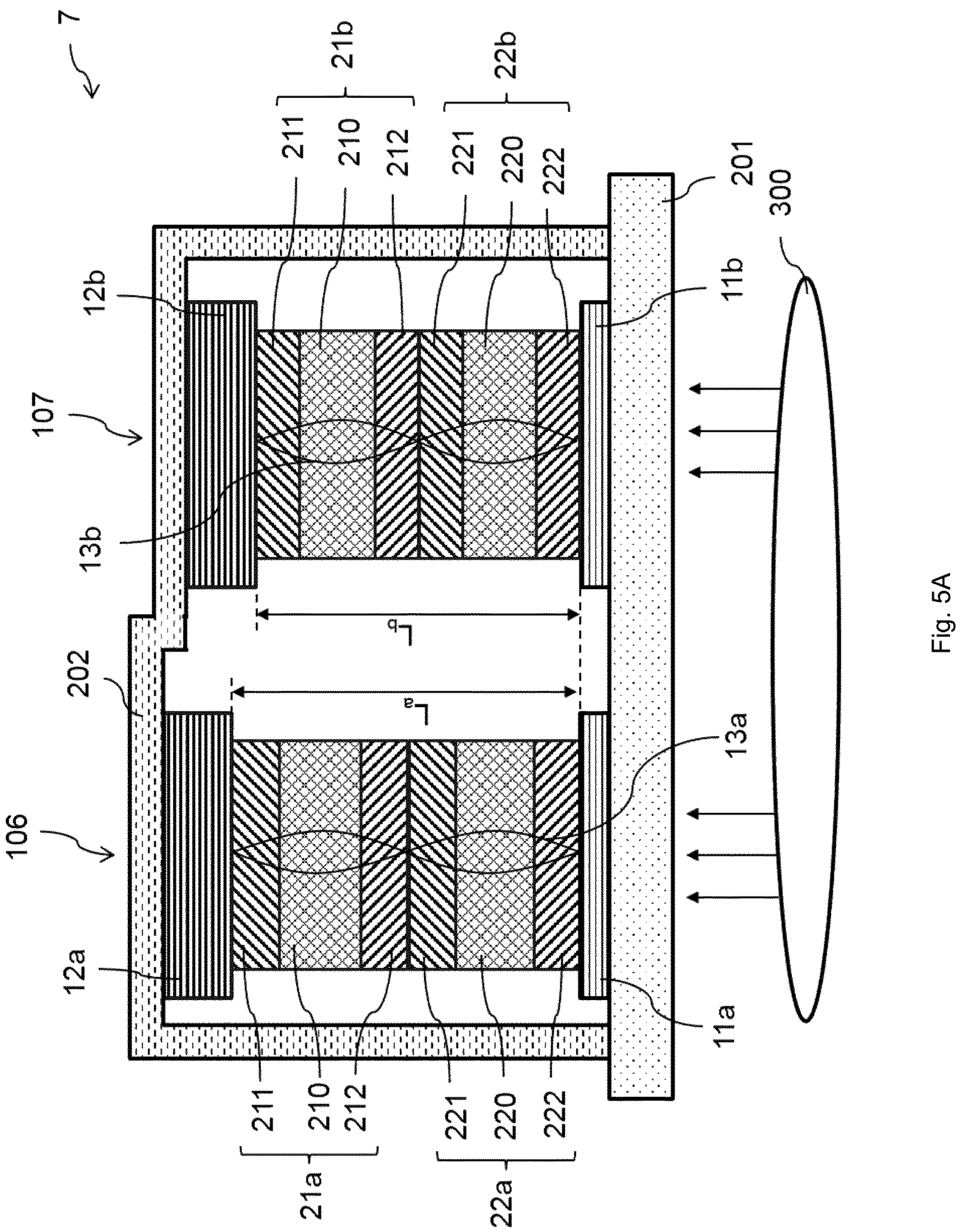
Figure 5B:
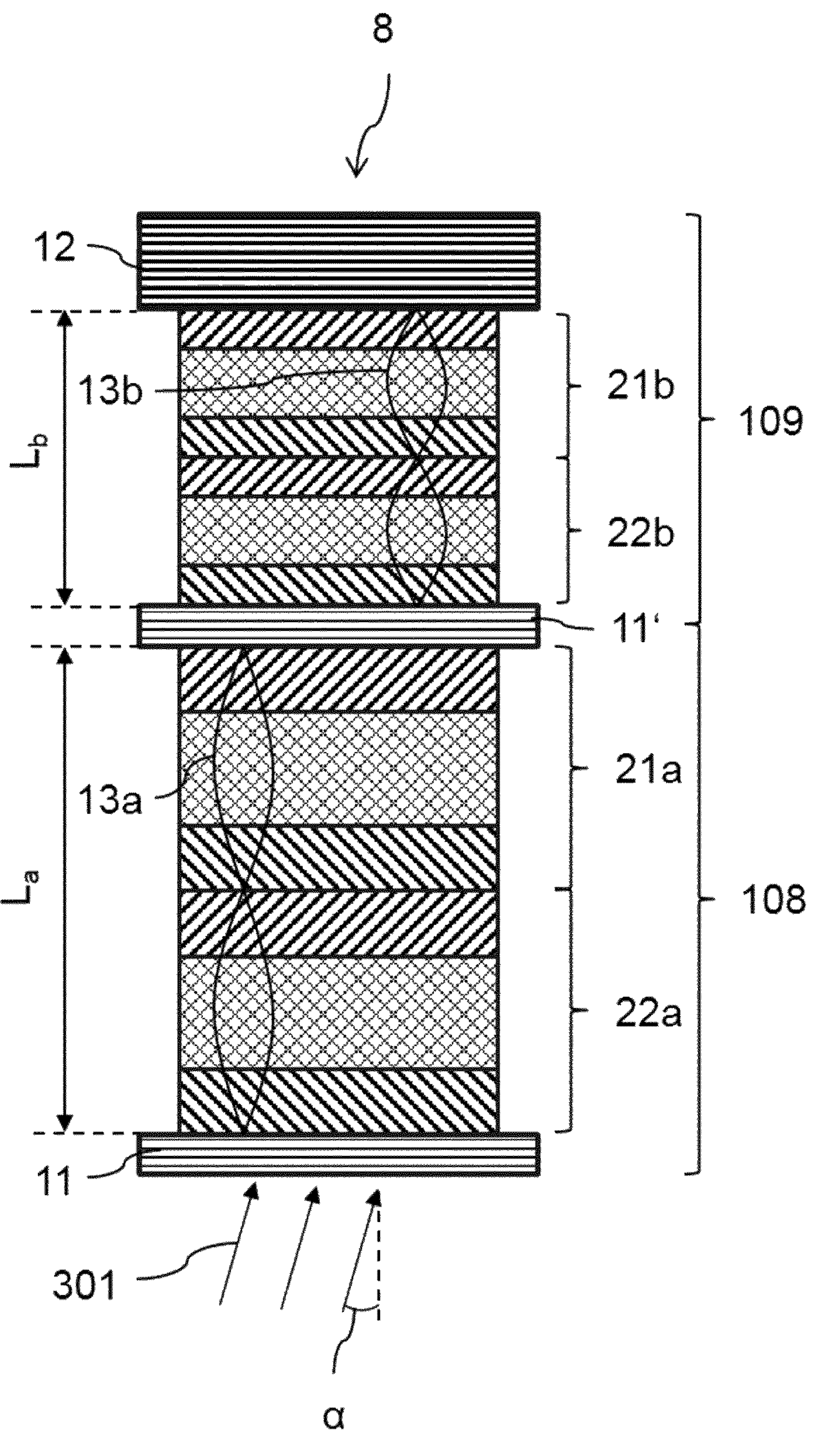
Figure 6B:
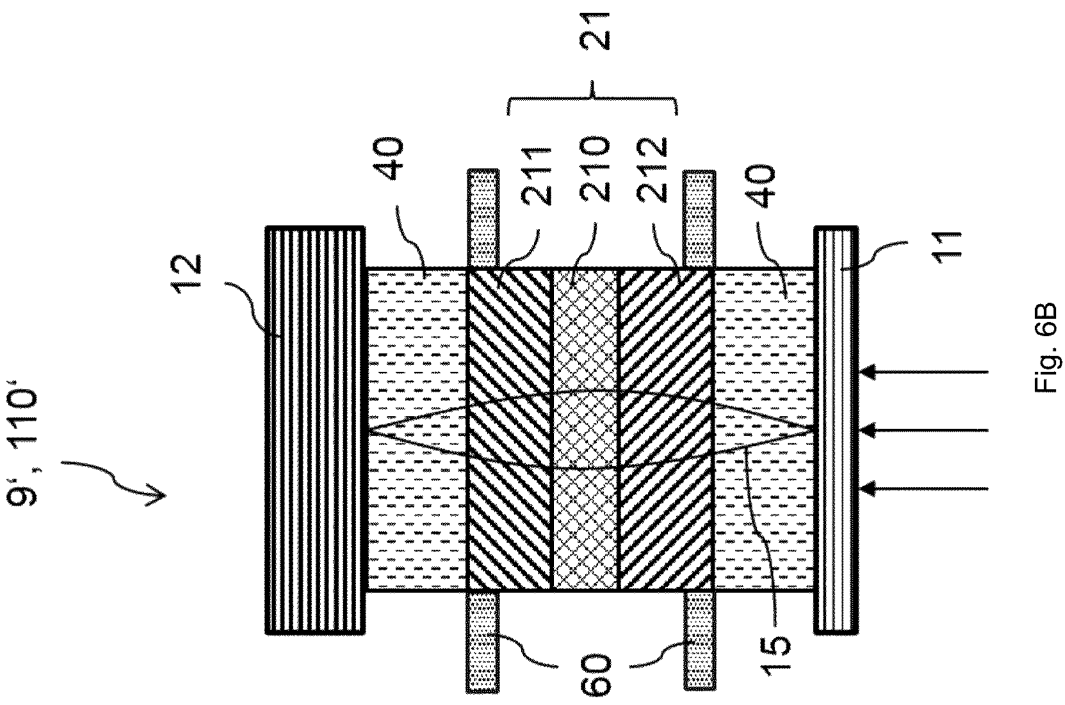
Figure 6A:
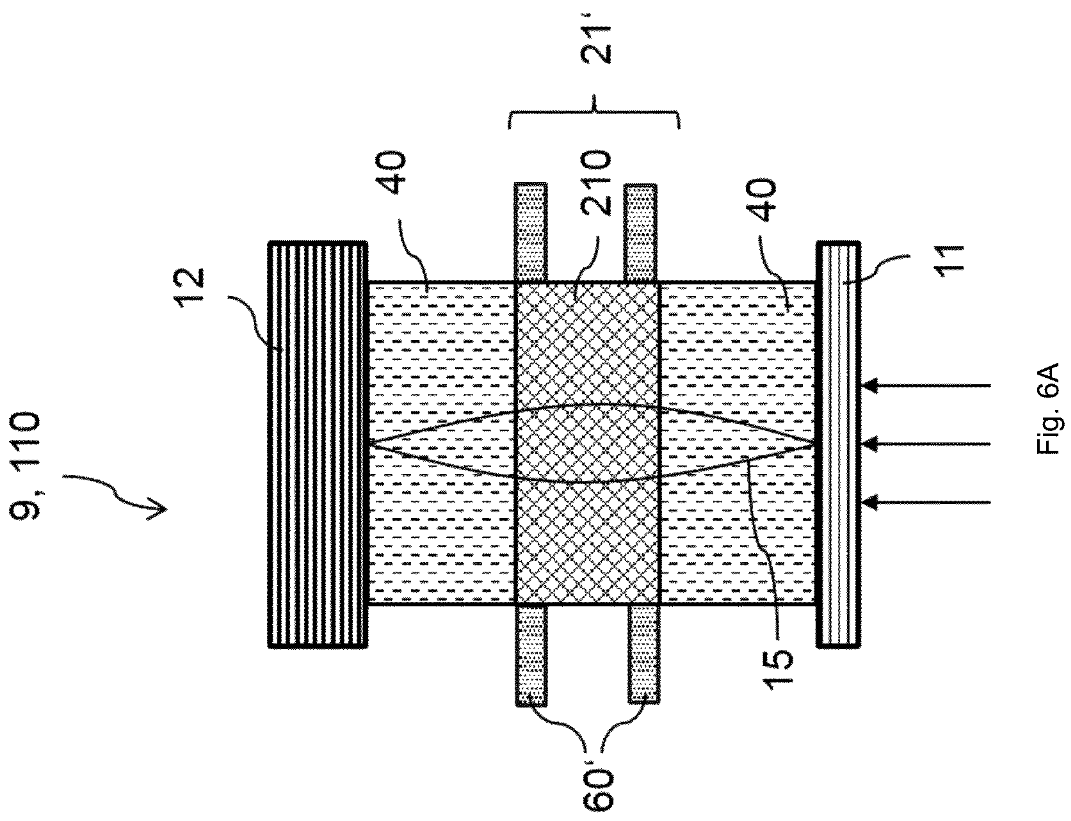
Figure 7:
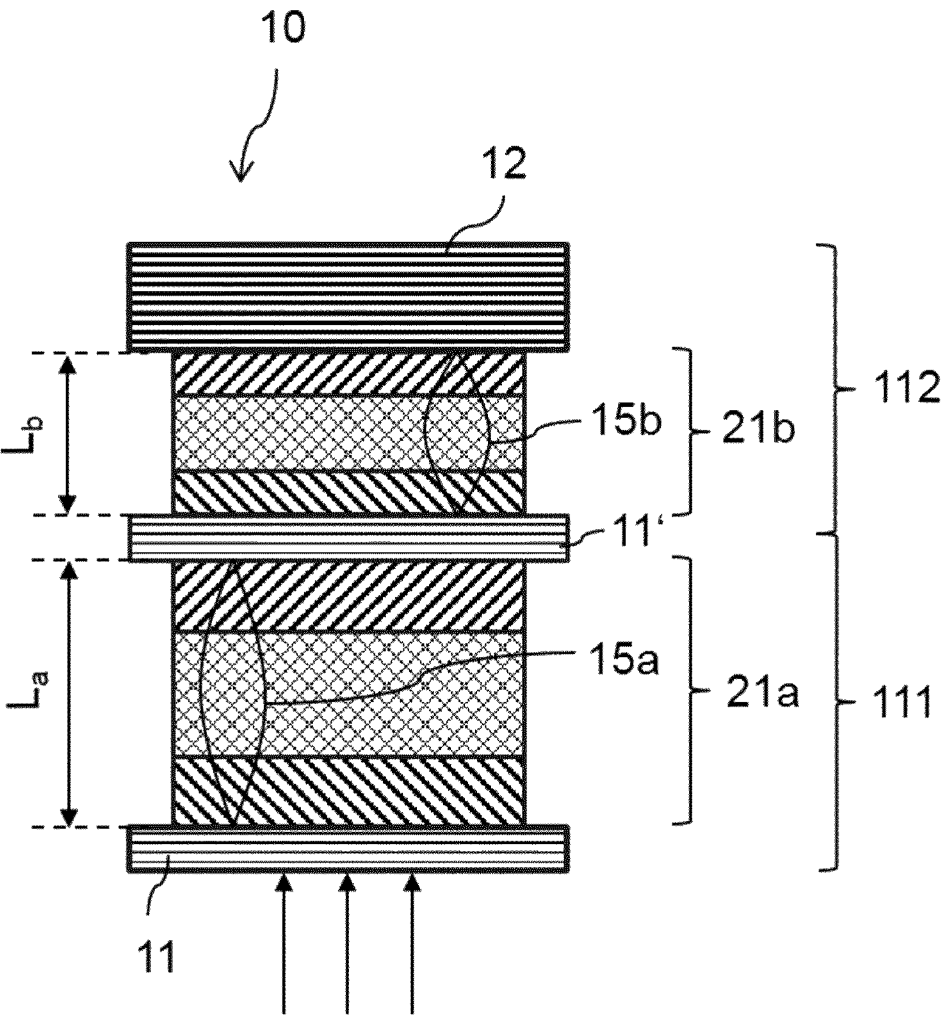

It is shown in longitudinal section, unless indicated otherwise, in:

FIG. 1A a first embodiment of the photodetector according to the first aspect of the invention, wherein the optoelectronic component is a 2nd-order component and comprises two detection cells, FIG. 1B a second embodiment of the photodetector according to the first aspect of the invention, wherein the optoelectronic component is a 2nd-order component and comprises one detection cell, FIG. 1C a third embodiment of the photodetector according to the first aspect of the invention, wherein the optoelectronic component is a $3^{rd}$-order component and comprises three detection cells, FIG. 2 a fourth embodiment of the photodetector according to the first aspect of the invention, wherein the optoelectronic component is a 2nd-order component and comprises an optically absorbing intermediate layer, FIG. 3 a fifth embodiment of the photodetector according to the first aspect of the invention, wherein the optoelectronic component is a 2nd-order component and comprises spacer layers and optically transparent and electrically conductive contact layers, FIG. 4A a sixth embodiment of the photodetector according to the first aspect of the invention, wherein the optoelectronic component is a 2nd-order component and comprises spacer layers and electrical outer contacts, FIG. 4B a top view of a cross-section through the photodetector of FIG. 4A along line A-A', FIG. 5A a seventh embodiment of the photodetector according to the first aspect of the invention, wherein the photodetector comprises two optoelectronic components arranged side by side, FIG. 5B an eighth embodiment of the photodetector according to the first aspect of the invention, wherein the photodetector comprises two optoelectronic components arranged one above the other, FIG. 6A a first embodiment of the photodetector according to the second aspect of the invention, wherein the optoelectronic component is a 1st-order component and comprises electrical outer contacts and optically transparent spacer layers, FIG. 6B a second embodiment of the photodetector according to the second aspect of the invention, wherein the detection cell comprises charge transport layers, and FIG. 7 an embodiment of the photodetector according to the third aspect of the invention, wherein the photodetector comprises two 1st-order optoelectronic components arranged one above the other.

FIGS. 1A to 5B show various embodiments of a photodetector according to the first aspect of the invention. Characteristic of all embodiments according to the first aspect of the invention is that at least one optoelectronic component is a second or higher order component.

FIG. 1A shows a first embodiment 1 of the photodetector according to the first aspect of the invention. The photodetector 1 has an optoelectronic component 100 which is arranged between a transparent first substrate 201, for example made of glass or transparent plastic, and a second substrate 202. The second substrate 202 may likewise be transparent, but may also be opaque, semi-transparent or reflective, and may for example be an encapsulation of glass, metal or plastic. Here, the optical properties of the first and second substrates 201, 202 relate to a radiation with the first wavelength to be detected in the photodetector 1. From a radiation source 300, incident radiation 301 is incident, which, for example, covers a broad spectrum of wavelengths from UV light to infrared radiation, i.e. in the range from 100 nm to 50 μm, or only different wavelengths of a spectral range, e.g. of the infrared range from 780 nm to 50 μm, or may include only a single wavelength in one of these ranges, on the photodetector 1. The incident radiation 301 may be, for example, radiation that has passed through a medium, e.g., a liquid, or that has been reflected from a medium, e.g., a solid, or may be radiation generated directly by the radiation source 300. The incident radiation 301 may enter the optoelectronic component 100 through the first substrate 201, as shown in FIG. 1A, but may also enter the optoelectronic component 100 through the second substrate 202 if the second substrate 202 is configured accordingly.

The optoelectronic component 100 has a semi-transparent first mirror layer 11, which is arranged adjacent to the first substrate 201, and a second mirror layer 12, which is fully reflective and arranged adjacent to the second substrate 202. Both mirror layers 11, 12 are made of silver (Ag), for example, wherein the first mirror layer 11 has a smaller thickness, for example 27 nm, than the second mirror layer 12, which has a thickness of 100 nm, for example. The first mirror layer 11 and the second mirror layer 12 are arranged parallel to each other at a distance L from each other and thus form an optical cavity between them. The length of the optical cavity, i.e., the distance L, and the thicknesses of the individual layers of the optoelectronic component 100 are measured perpendicular to the parallel planes of the mirror layers 11 and 12, respectively. For specific first wavelengths of the incident radiation 301, standing resonant waves of different orders and corresponding resonant wavelengths are formed in the optical cavity according to the aforementioned formula (1). Exemplarily, a resonant wave 13 of 2nd order is shown in FIG. 1A, the wavelength of which is related to the first wavelength to be detected in the photodetector 1 via the effective refractive index of the optical cavity and the layers present in the radiation path, e.g. the first substrate 201 and the first mirror layer 11. Two detection cells 21 and 22 are arranged in the optical cavity, i.e. between the mirror layers 11 and 12, for detecting the resonant wave. Here, each detection cell 21, 22 contains a photoactive layer 210 and 220, respectively, to which a first charge transport layer 211 and 221, respectively, are adjacent on one side with respect to the length of the optical cavity, and a second charge transport layer 212 and 222, respectively, are adjacent on the other side with respect to the length of the optical cavity. The first charge transport layer 211 or 221 is, for example, a hole-conducting material, while the second charge transport layer 212 or 222 is an electron-conducting material. The photoactive layers 210, 220 are made of TPDP:C60, for example, and have a thickness of 100 nm. The photoactive layers 210, 220 are each arranged within the optical cavity in such a way that in each case exactly one intensity maximum (also called oscillation antinode) of the resonant wave 13 lies within one of the photoactive layers 210, 220. Since the resonant wave 13 detected by the optoelectronic component 100 is a 2nd-order wave, the optoelectronic component 100 is referred to as a 2nd-order component.

The first charge transport layer 211 of the first detection cell 21 is adjacent to the second mirror layer 12, and the second charge transport layer 222 of the second detection cell 22 is adjacent to the first mirror layer 11. Furthermore, the second charge transport layer 212 of the first detection cell 21 and the first charge transport layer 221 of the second detection cell 22 are adjacent to each other. The electrical signals generated in the detection cells 21 and 22 are transmitted through the mirror layers 11 and 12, which are electrically conductive and connected in an electrically conductive manner to an evaluation unit, the evaluation unit being suitable for generating from the electrical signals a qualitative and/or quantitative statement about the radiation of the first wavelength contained in the incident radiation 301.

With reference to FIGS. 1B and 10, the concept of order will be further explained with respect to the optoelectronic component. The representation of the substrates as well as the radiation source is omitted in most of the following figures.

FIG. 1B shows an optoelectronic component 101 of a second embodiment 2 of the photodetector according to the first aspect of the invention. In contrast to the optoelectronic component 100 of FIG. 1A, only one detection cell 21 is arranged in the optical cavity of the optoelectronic component 101, which is configured as described with reference to FIG. 1A. Instead of the second detection cell 22 of the optoelectronic component 100 of FIG. 1A, an optically absorbing and electrically conducting intermediate layer 30 and an optically transparent spacer layer 40 are now arranged between the detection cell 21 and the first mirror layer 11. Here, the photoactive layer 210 of the detection cell 21 is again arranged in exactly one intensity maximum of the resonant wave 13, which is again a 2nd-order resonant wave, while the intermediate layer 30 is arranged in the middle node of the resonant wave 13. Since the intermediate layer 30 is designed to be optically absorbing, all other resonant waves that would in principle be formed in the optical cavity between the mirror layers 11 and 12 and whose oscillation nodes are not located in the intermediate layer 30 are cancelled. Thus, in particular, the resonant waves of neighboring orders, i.e., the 1st-order and 3rd-order resonant waves, are extinguished.

In the case shown in FIG. 1B, the spacer layer 40 is made of a material that is not electrically conductive or is only poorly electrically conductive, e.g. $Al_2O_3$. Therefore, the intermediate layer 30 also serves as a contact layer for forwarding the electrical signals generated in the detection cells 21 to an evaluation unit and is formed for this purpose from an electrically conductive material, e.g. Ag:Ca, and with a thickness of, for example, 6 nm, the intermediate layer 30 being connected in an electrically conductive manner to the evaluation unit. For this purpose, the intermediate layer 30 is formed in such a way that it protrudes beyond the lateral edge of the other layers in the optical cavity and can be connected, for example, via terminals or other connecting elements, e.g. bonding wires, with an electrical line to the evaluation unit. If the material of the spacer layer is electrically conductive, the intermediate layer can also be designed to be absorbent and only slightly electrically conductive. Furthermore, the intermediate layer can also be dispensed with entirely if the effect of cancelling out other resonant waves is not desired. Likewise, in other embodiments it is also possible to make the intermediate layer non-absorbent but electrically conductive, so that an electrical connection of the detection cell 21 to the evaluation unit is possible via the intermediate layer, but no cancellation of resonant waves takes place.

Although the optoelectronic component 101 has only one detection cell 21, the optoelectronic component 101 is also a 2nd-order component because it detects and evaluates a 2nd-order resonant wave.

In FIG. 10, an optoelectronic component 102 of a third embodiment 3 of the photodetector according to the first aspect of the invention is shown. Here, a 3rd-order resonant wave 14 is detected, so that the optoelectronic component 102 is a 3rd-order component. The optoelectronic component 102 has three detection cells 21 to 23, each including a photoactive layer 210, 220 and 230, respectively, and two charge transport layers 211 and 212 and 221 and 222 and 231 and 232, respectively, which are arranged one above the other in the optical cavity. In this regard, the photoactive layers 210, 220 and 230 are each arranged in the optical cavity such that exactly one oscillation maximum of the resonant wave 14 is located in each of the photoactive layers 210, 220 and 230, respectively. Of course, the optoelectronic component 102 could also have only one or two detection cells, in which case it continues to be a 3rd-order component as long as the respective photoactive layers of the detection cells each lie at the location of exactly one oscillation maximum of the resonant wave 14.

With reference to FIGS. 2 to 4B, further embodiments of the optoelectronic component of the photodetector according to the first aspect of the invention are described, with 2nd order components being shown as examples in each case. Thus, FIG. 2 shows an optoelectronic component 103 of a fourth embodiment 4 of the photodetector, wherein the optoelectronic component 103 comprises two detection cells 21 and 22. An optically absorbing intermediate layer 31, which is, however, not electrically conductive, is arranged between the detection cells 21 and 22. However, the intermediate layer 31 may not impede charge transport if the individual detection cells 21 and 22 are not individually electrically contacted to the outside, as shown in FIG. 2. In this case, the intermediate layer 31 is conductive for at least one type of charge carrier, i.e. electrons or holes, or for both. This can be achieved by a very thin formation of the intermediate layer 31. For example, the intermediate layer 31 can be made of a metal layer, e.g. Ag, or a mixed metal layer, e.g. Ag:Ca, with a thickness in the range of 1 nm to 5 nm. The intermediate layer 31 can also consist of a very thin, highly doped organic layer that absorbs in the corresponding wavelength range of the resonant wave, e.g. BFDPB:NDP9 with a thickness of 1 nm. Alternatively, the intermediate layer 31 may also be present as a structured layer and have holes that allow charge transport from one adjacent layer to another adjacent layer, while the present regions of the intermediate layer 31 lead to cancellation of resonant waves of adjacent orders. The intermediate layer 31 is used to cancel resonant waves of adjacent orders (adjacent to the order of the resonant wave 13). In order to avoid cancellation of the resonant wave 13, the intermediate layer 31 is arranged within the optical cavity at a position of the central oscillation node of the resonant wave 13 and is formed only thinly, for example with a thickness in the range of 1 nm to 5 nm. The connection to the evaluation unit is established via the electrically conductive mirror layers 11 and 12 as in the optoelectronic component 100 of FIG. 1A, but can also be implemented differently in other embodiments.

For optoelectronic components of higher order, which are designed for the detection of resonant waves of higher order than 2nd order, several optically absorbing intermediate layers are preferably formed. These are each arranged in such a way that each oscillation node of the resonant wave lies in exactly one optically absorbing intermediate layer.

FIG. 3 shows an optoelectronic component 104 of a fifth embodiment 5 of the photodetector, wherein spacer layers 40 and electrically conductive, optically transparent contact layers 50 are arranged in the optical cavity of the optoelectronic component 104 in addition to the detection cells 21 and 22. The detection cells 21 and 22 are each spaced from each other and from the adjacent mirror layers 11 and 12, respectively, by the spacer layers 40. Since the spacer layers 40 in the present case are not electrically conductive or are only poorly conductive and thus no electrical contact to the detection cells 21 and 22 is possible via the mirror layers 11 and 12, respectively, the electrical signals generated by the detection cells 21 and 22 are transmitted to the evaluation unit via the contact layers 50. For this purpose, the contact layers 50 are respectively arranged adjacent to and between the first and second charge transport layers 211 and 212 and 221 and 222, respectively, and the spacer layers 40 and can each be electrically conductively connected to the evaluation unit. In this case, the contact layers 50 are formed areally, i.e. they are each formed over the entire lateral extent of the charge transport layers 211, 212, 221 and 222. Since the contact layers 50 are arranged in regions of the optical cavity in which the intensity of the resonant wave 13 has no nodal point but an intensity not equal to 0 (zero), the contact layers 50 must be made of an optically transparent material to prevent extinction of the resonant wave 13. The contact layers 50 can, for example, consist of PEDOT:PSS, ITO, ZnO or other conductive oxides and each have a thickness of, for example, 10 nm to 40 nm. Here, too, the contact layers 50 protrude laterally somewhat beyond the other layers in the optical cavity in order to be able to realize an electrical connection to the evaluation unit, as already explained with reference to the intermediate layer 30 in FIG. 1B.

A further possibility of electrical contacting to the evaluation unit is shown with reference to an optoelectronic component 105 of a sixth embodiment 6 of the photodetector in FIGS. 4A and 4B. Here, the optoelectronic component 105 differs from the optoelectronic component 104 of FIG. 3 in that there are no two-dimensional contact layers, but the electrical connection between the charge transport layers 211, 212, 221 and 222 is made in each case via electrical outer contacts 60. The outer contacts 60 consist of an electrically conductive material, for example Ag, and adjoin at least part of the outer surface of the charge transport layers 211, 212, 221 and 222. In this regard, an outer surface of the charge transport layers 211, 212, 221, and 222 extends along the length of the optical cavity and is not adjacent to any other layer of the optoelectronic component 104 other than the outer contacts 60. The outer contacts 60 may also overlap with a portion of the charge transport layers 211, 212, 221, and 222, i.e., be adjacent to a surface of the charge transport layers 211, 212, 221, and 222 that extends parallel to the mirror layers 11, 12, or may extend into the charge transport layers 211, 212, 221, and 222. However, the outer contacts 60 do not extend over the entire lateral extent of the charge transport layers 211, 212, 221 and 222. By drawing the outer contacts into the optical cavity in this manner, the active region of the optoelectronic component, i.e., the region in which standing waves can be generated, is laterally limited, i.e., in a plane perpendicular to the length of the optical cavity. Furthermore, the outer contacts can also serve as an optical aperture mask. Thus, the outer contacts 60 hardly influence the optical formation or propagation of the resonant wave 13. Preferably, the outer contacts 60 surround the charge transport layers 211, 212, 221 and 222 along the entire circumference of the outer surface in cross-section through the optoelectronic component, as shown in FIG. 4B. FIG. 4B shows a cross-section through the optoelectronic component 105 of FIG. 4A along line A-A'. Here, the electrical outer contact 60 forms a frame around the first charge transport layer 211. Electrical connection elements or connection lines to the evaluation unit can again engage the electrical outer contacts 60, as already described with reference to FIG. 1B.

Of course, other combinations of the structures and layers of the optoelectronic component described in FIGS. 1A to 4B are also possible, whereby optimization of various layers with respect to their optical and/or electrical properties and optimization of the optoelectronic component with respect to its detection properties and/or its manufacture are possible.

With reference to FIGS. 5A and 5B, embodiments of the photodetector according to the first aspect of the invention are described, wherein the photodetector comprises in each case two optoelectronic components suitable for detecting different wavelengths in the incident radiation. Of course, the number of optoelectronic components can be expanded as desired and both embodiments can also be combined.

FIG. 5A shows a seventh embodiment 7 of the photodetector with two optoelectronic components 106 and 107, wherein they are arranged laterally side by side. That is, the optoelectronic components 106 and 107 are arranged side by side along a direction perpendicular to the lengths of the optical cavities of the two components 106 and 107. In the illustrated case, the two devices 106 and 107 are arranged side by side on the transparent first substrate 201 and are separated from the environment by the second substrate 202 in the form of an encapsulation. The first optoelectronic component 106 has a first mirror layer 11*a*, a second mirror layer 12*a*, and two detection cells 21*a* and 22*a*, wherein the first optical cavity formed between the mirror layers 11*a* and 12*a* has a length La. The second optoelectronic component 107 has a first mirror layer 11*b*, a second mirror layer 12*b*, and two detection cells 21*b* and 22*b*, the second optical cavity formed between the mirror layers 11*b* and 12*b* having a length Lb. Here, Lb<La in the illustrated case. Both optoelectronic components 106 and 107 are 2nd-order components, wherein when the materials for the individual layers of the components 106 and 107 are the same, the first optoelectronic component 106 can detect a first wavelength corresponding to the formed first resonant wave 13*a*, and the second optoelectronic component 107 can detect a second wavelength corresponding to the formed second resonant wave 13*b*, the first wavelength being longer than the second wavelength. However, in other embodiments, the optoelectronic components may also differ with respect to the order of the respective resonant wave for the same length of the optical cavity or with respect to the order of the respective resonant wave and the length of the optical cavity. In the case shown, the first mirror layers 11*a* and 11*b* and the second mirror layers 12*a* and 12*b* serve to read out the electrical signals generated in the optoelectronic components 106 and 107 and are connected in an electrically conductive manner to an evaluation unit (not shown) for this purpose. In other embodiments, the electrical signals can also be transmitted to the evaluation unit via the intermediate or contact layers or outer contacts shown with reference to FIGS. 1B and 3 to 4B, in which case the detection cells can be electrically isolated from one or both mirror layers of the respective component. In this case, mirror layers of different optoelectronic components which are electrically isolated from an adjacent detection cell can also be formed together and interconnected.

FIG. 5B shows an eighth embodiment 8 of the photodetector with two optoelectronic components 108 and 109, wherein these are arranged one above the other. That is, the lengths of the first optical cavity and the second optical cavity of the optoelectronic components 108 and 109 extend along a common line, the first and second optical cavities being connected to each other by a semi-transparent mirror layer. In other words, the optoelectronic components 108 and 109 are stacked on top of each other so that incident radiation does not reach one of the optoelectronic components until it has passed through the other optoelectronic component. In the illustrated case, the incident radiation 301 enters the optoelectronic component 109 only after passing through the optoelectronic component 108.

The first optoelectronic component 108 has a semi-transparent mirror layer 11, a semi-transparent mirror layer 11', and two detection cells 21*a* and 22*a*, wherein the first optical cavity formed between the mirror layers 11 and 11' has a length $L_a$. The second optoelectronic component 109 has the semi-transparent mirror layer 11', a second mirror layer 12, and two detection cells 21*b* and 22*b*, the second optical cavity formed between the mirror layers 11' and 12 having a length $L_b$. Here, in the case shown, $L_b<L_a$. However, $L_b>L_a$ is also possible. Both optoelectronic components 108 and 109 are 2nd-order components, wherein, if the materials for the individual layers of the components 108 and 109 are the same, the first optoelectronic component 108 can detect a first wavelength corresponding to the formed first resonant wave 13*a*, and the second optoelectronic component 109 can detect a second wavelength corresponding to the formed second resonant wave 13*b*, the first wavelength being longer than the second wavelength. However, in other embodiments, the optoelectronic components may also differ with respect to the order of the respective resonant wave for the same length of the optical cavity or with respect to the order of the respective resonant wave and the length of the optical cavity.

Thus, with the eighth embodiment 8 of the photodetector, it is possible to detect two different wavelengths in the incident radiation 301 in a space-saving manner. One or more further optoelectronic components can also be stacked on top of each other, so that more than two different wavelengths can also be detected with a photodetector that only requires the lateral space of one optoelectronic component.

Furthermore, this embodiment enables the formation of a photodetector that is selectively responsive to the angle of incidence a of the incident radiation 301. In this case, for example, the optoelectronic component 108 would detect the presence of the first wavelength associated with the wavelength of the first resonant wave 13*a* in the incident radiation 301 at large angles of incidence a, while the optoelectronic component 109 detects the presence of the first wavelength in the incident radiation 301 via the detection of the associated second resonant wave 13*b* for small angles of incidence a. Here, the wavelengths of the first and second resonant waves 13*a*, 13*b* correspond to the first wavelength in the incident radiation 301 and the angle of incidence a.

In the case shown, the mirror layers 11, 11' and 12 serve to read out the electrical signals generated in the optoelectronic components 108 and 109 and are connected for this purpose in an electrically conductive manner to an evaluation unit (not shown). In other embodiments, the electrical signals can also be transmitted to the evaluation unit via the intermediate or contact layers or outer contacts shown with reference to FIGS. 1B and 3 to 4B, in which case the detection cells can be electrically insulated from one or both mirror layers of the respective component.

Of course, both embodiments explained with reference to FIGS. 5A and 5B can also be implemented simultaneously in a photodetector, i.e., different optoelectronic components can be arranged one above the other as well as side by side. In addition, the optoelectronic components may also each be formed according to one of the embodiments described with reference to FIGS. 1B, and 2 to 4B, i.e., they may have spacer layers, optically absorbing intermediate layers, optically absorbing and electrically conductive intermediate layers, optically transparent and electrically conductive contact layers, and/or electrical outer contacts, wherein different optoelectronic components may be configured differently.

FIG. 6A shows a first embodiment 9 of the photodetector according to the second aspect of the invention. According to the second aspect of the invention, the photodetector may also comprise only a 1st order optoelectronic component. In FIG. 6A, this is the optoelectronic component 110, which comprises a semi-transparent first mirror layer 11 and a second mirror layer 12, and a detection cell 21' in the optical cavity present between these mirror layers 11, 12. The detection cell 21' has a photoactive layer 210 but no charge transport layers. Here, the photoactive layer 210 is arranged in the optical cavity such that an oscillation maximum of the resonant wave 15, which is a 1st-order resonant wave, is located within the photoactive layer 210. The photoactive layer 210 is spaced apart from the mirror layers 11 and 12, respectively, by spacer layers 40 which are optically transparent and electrically insulating. The photoactive layer 210 is connectable to an evaluation unit via at least two electrical outer contacts 60', similar to the outer contacts 60 already explained with reference to FIGS. 4A and 4B, so that the electrical signals generated in the detection cell 21 can be read out. The outer contacts 60' are made of an electrically conductive material, e.g. Ag, and are adjacent to at least a part of the outer surface of the photoactive layer 210. In this regard, an outer surface of the photoactive layer 210 extends along the length of the optical cavity and is not adjacent to any other layer of the optoelectronic component 110 other than the outer contacts 60'. The outer contacts 60' may also overlap with a portion of the photoactive layer 210, i.e., abut a surface of the photoactive layer 210 that extends parallel to the mirror layers 11, 12, or may extend into the photoactive layer 210. However, the outer contacts 60' do not extend over the entire lateral extent of the photoactive layer 210, but at most over a small portion, at most 10% of the entire lateral extent. Preferably, the outer contacts 60' surround the photoactive layer along the entire perimeter of the outer surface in cross-section through the optoelectronic component, similar to what is shown for the outer contacts 60 in FIG. 4B. In any case, one of the outer contacts 60' is disposed on a first side of the photoactive layer 210 and another of the outer contacts 60' is disposed on a second side of the photoactive layer 210, the first side and the second side being spaced apart and facing each other along the length of the optical cavity. In this regard, the first side is closer to the first mirror layer 11, while the second side is closer to the second mirror layer 12. In this regard, the photoactive layer 210 is formed at least thick enough so that the outer contact 60' on the first side of the photoactive layer 210 is electrically separated, i.e. isolated, from the outer contact 60' on the second side of the photoactive layer 210. By separating the optical and electrical functions of the individual layers from each other, for example the reflective function of the mirror layers 11, 12 from an electrical conductivity to the outside, all components of the optoelectronic component 110 can be optimized with respect to either their optical or their electrical properties. By utilizing the external contacts 60', optical losses within the optical cavity are further reduced, thereby further improving the quality and effectiveness of the detection of the photodetector.

FIG. 6B shows a second embodiment 9' of the photodetector according to the second aspect of the invention. The second embodiment 9' is similar to the first embodiment 9. However, in addition to a photoactive layer 210, the detection cell 21 of the optoelectronic component 110' also has a first charge transport layer 211 and a second charge transport layer 212, similar to the previously described detection cells of a photodetector according to the first aspect. The charge transport layers 211 and 212 are respectively spaced from the mirror layers 11 and 12 adjacent to them by spacer layers 40 that are optically transparent and electrically insulating. The charge transport layers 211 and 212 are each connectable to an evaluation unit via electrical outer contacts 60, as already explained with reference to FIGS. 4A and 4B, so that the electrical signals generated in the detection cell 21 can be read out. The photoactive layer 210 in this embodiment may be thinner than in the first embodiment 9. Again, all components of the optoelectronic component 110' may be optimized with respect to either their optical or their electrical properties. By utilizing the outer contacts 60, optical losses within the optical cavity are further reduced, thereby further improving the quality and effectiveness of the detection of the photodetector.

FIG. 7 shows an embodiment 10 of the photodetector according to the third aspect of the invention. According to the third aspect of the invention, the photodetector, similar to the eighth embodiment 8 of the photodetector according to the first aspect of the invention, has two optoelectronic components arranged one above the other, but both optoelectronic components may be 1st-order components. Accordingly, in the illustrated embodiment, the photodetector 10 has two optoelectronic components 111 and 112 arranged one above the other such that the lengths of the optical cavities of both components 111 and 112 extend along a common line. The first optoelectronic component 111 has a semi-transparent mirror layer 11 and a semi-transparent mirror layer 11' and a detection cell 21*a* disposed therebetween, wherein the corresponding photoactive layer of the detection cell 21*a* is located in the oscillation maximum of the resonant wave 15*a*, which is a 1st-order resonant wave. In this case, the optical cavity of the optoelectronic component 111 has a length $L_a$ corresponding to a first wavelength to be detected in the incident radiation. The second optoelectronic component 112 has the semi-transparent mirror layer 11' and a mirror layer 12 and a detection cell 21*b* disposed therebetween, wherein the corresponding photoactive layer of the detection cell 21*b* is located in the oscillation maximum of the resonant wave 15*b*, which is also a 1st-order resonant wave. In this case, the optical cavity of the optoelectronic component 112 has a length $L_b$ corresponding to a second wavelength to be detected in the incident radiation and, in the illustrated example, is smaller than the length $L_a$. In other embodiments, however, $L_b$ may be greater than $L_a$.

As described with reference to FIG. 5B, the dependence of the wavelength of the resonant waves 15*a*, 15*b* on the angle of incidence of the incident radiation can also be used for angle-selective detection of specific wavelengths in the incident radiation.

The two optoelectronic components 111 and 112 share the semitransparent mirror layer 11'. In the embodiment shown, the mirror layers 11, 11' and 12 serve to read out the electrical signals generated in the detection cells 21*a* and 21*b* and can be connected to an evaluation unit in an electrically conductive manner for this purpose. Of course, in other embodiments, other possibilities for establishing an electrical contact to the charge transport layers of the detection cells, e.g., optically transparent and electrically conductive contact layers or electrical outer contacts as described above, can be implemented and/or the detection cells can be spaced from adjacent mirror layers by spacer layers.

Within the scope of the invention, the embodiments or individual features of the various aspects or embodiments may also be combined to form the photodetector, as long as they are not mutually exclusive.

Various examples are described below that pertain to what has been described and illustrated above.

Example 1 is a photodetector for detecting electromagnetic radiation in a spectrally selective manner, having a first optoelectronic component for detecting a first wavelength of the electromagnetic radiation, comprising:

- a first optical cavity formed by two mutually spaced parallel mirror layers, the length of the first optical cavity being such that an ith-order resonant wave associated therewith is formed in the first optical cavity for the first wavelength, and
- at least one detection cell arranged in the first optical cavity, each detection cell containing a photoactive layer, the photoactive layer being arranged in each case within the first optical cavity in such a way that exactly one oscillation maximum of the resonant wave lies within the photoactive layer, wherein the order of the resonant wave of the first optoelectronic component is greater than 1.

Example 2 is a photodetector according to Example 1, wherein at least one detection cell disposed in the first optical cavity further contains a first charge transport layer and a second charge transport layer between which the photoactive layer is disposed, wherein the first charge transport layer, the photoactive layer, and the second charge transport layer are disposed one on top of the other along the length of the first optical cavity.

In Example 3, the photodetector according to Example 1 or 2 may have a number of the detection cells arranged in the first optical cavity which corresponds to the order of the resonant wave.

In Example 4, in the photodetector according to any one of Examples 1 to 3, at least one intermediate optical absorbing layer is arranged in the first optical cavity, respectively, such that an oscillation node of the resonant wave is located in the absorbing intermediate layer.

In Example 5, in the photodetector according to Example 4, at least one of the at least one optically absorbing intermediate layer is directly adjacent to one of the at least one detection cell, is made of an electrically conductive material, and is adapted to be connected in an electrically conductive manner to an evaluation unit adapted to evaluate the electrical signals generated by the at least one detection cell of the first optoelectronic component.

In Example 6, in the photodetector according to any one of Examples 1 to 4, at least one optically transparent contact layer is arranged in the first optical cavity, which is directly adjacent to one of the at least one detection cell, is made of an electrically conductive material, and is suitable for being connected in an electrically conductive manner to an evaluation unit suitable for evaluating the electrical signals generated by the at least one detection cell of the first optoelectronic component.

In Example 7, the first optoelectronic component of the photodetector according to any one of Examples 1 to 4 comprises at least one outer contact adjacent to an outer surface of one of the at least one detection cell, made of an electrically conductive material and adapted to be connected in an electrically conductive manner to an evaluation unit adapted to evaluate the electrical signals generated by the at least one detection cell of the first optoelectronic component.

In Example 8, in the photodetector according to any of Examples 1 to 7, at least one optically transparent spacer layer is arranged in the first optical cavity and is arranged between one of the mirror layers and a detection cell adjacent to that mirror layer.

In Example 9, in a photodetector according to any one of Examples 1 to 8, at least two detection cells are arranged in the first optical cavity, and an optically transparent spacer layer is arranged between two detection cells arranged one above the other in the first optical cavity along the length of the first optical cavity.

In Example 10, a photodetector according to any one of Examples 1 to 9 contains a second optoelectronic component for detecting a second wavelength of electromagnetic radiation, the second optoelectronic component comprising:

a second optical cavity formed by two mutually spaced parallel mirror layers, the length of the second optical cavity being such that, for the second wavelength, a jth-order resonant wave associated therewith is formed in the second optical cavity, and at least one detection cell arranged in the second optical cavity, each detection cell containing a photoactive layer, the photoactive layer being arranged in each case within the second optical cavity in such a way that exactly one oscillation maximum of the resonant wave lies within the photoactive layer.

In this case, the length of the first optical cavity differs from the length of the second optical cavity and/or the order of the resonant wave associated with the second wavelength differs from the order of the resonant wave associated with the first wavelength.

In an Example 11, in the photodetector of Example 10, the first and second optoelectronic components are arranged side by side along a direction perpendicular to the length of the first and second optical cavities.

In an Example 12, in the photodetector of Example 10, the first and second optoelectronic components (108, 109) are arranged one above the other such that the lengths of the first optical cavity and the second optical cavity extend along a common line, the first and second optical cavities being interconnected by a semi-transparent mirror layer.

Example 13 is a photodetector for detecting electromagnetic radiation in a spectrally selective manner, having a first optoelectronic component for detecting a first wavelength of the electromagnetic radiation, comprising:

a first optical cavity formed by two mutually spaced parallel mirror layers, the length of the first optical cavity being such that, for the first wavelength, a first-order resonant wave associated therewith is formed in the first optical cavity, a detection cell arranged in the first optical cavity and containing a photoactive layer, the photoactive layer being arranged within the first optical cavity in such a way that the oscillation maximum of the resonant wave lies within the photoactive layer, and at least one optically transparent spacer layer arranged within said first optical cavity between one of said mirror layers and said detection cell, wherein the first optoelectronic component comprises at least one outer contact which is adjacent to an outer surface of the detection cell, consists of an electrically conductive material and is adapted to be connected in an electrically conductive manner to an evaluation unit which is suitable for evaluating the electrical signals generated by the detection cell of the first optoelectronic component.

In an Example 14, the detection cell of the photodetector of Example 13 arranged in the first optical cavity further contains a first charge transport layer and a second charge transport layer between which the photoactive layer is arranged, wherein the first charge transport layer, the photoactive layer, and the second charge transport layer are arranged one above the other along the length of the first optical cavity.

In an Example 15, the photodetector according to one of Examples 13 or 14 has two optically transparent spacer layers disposed in the first optical cavity, a first spacer layer of which is arranged between a first of the mirror layers and the detection cell, and a second spacer layer of which is arranged between a second of the mirror layers and the detection cell. Further, the first optoelectronic component of the photodetector of Example 15 has at least two outer contacts, one outer contact being adjacent to the outer surface of the detection cell on a first side and one outer contact being adjacent to the outer surface of the detection cell on a second side, the first side and the second side of the detection cell being opposite each other along the length of the first optical cavity.

Example 16 is a photodetector for detecting electromagnetic radiation in a spectrally selective manner, having a first optoelectronic component for detecting a first wavelength of the electromagnetic radiation, comprising:

a first optical cavity formed by two mutually spaced parallel mirror layers, the length of the first optical cavity being such that for the first wavelength an ith-order resonant wave associated therewith is formed in the first optical cavity, and at least one detection cell arranged in the first optical cavity, each detection cell containing a photoactive layer, the photoactive layer being arranged in each case within the first optical cavity in such a way that exactly one oscillation maximum of the resonant wave lies within the photoactive layer, and a second optoelectronic component for detecting a second wavelength of the electromagnetic radiation, comprising a second optical cavity formed by two mutually spaced parallel mirror layers, the length of the second optical cavity being such that, for the second wavelength, a jth-order resonant wave associated therewith is formed in the second optical cavity, and at least one detection cell arranged in the second optical cavity, each detection cell containing a photoactive layer, the photoactive layer being arranged in each case within the second optical cavity in such a way that exactly one oscillation maximum of the resonant wave lies within the photoactive layer, wherein the length of the second optical cavity differs from the length of the first optical cavity and/or the order of the resonant wave associated with the second wavelength differs from the order of the resonant wave associated with the first wavelength, and the first and second optoelectronic components are superimposed so that the lengths of the first and second optical cavities extend along a common line, the first and second optical cavities being interconnected by a semi-transparent mirror layer which is one of the mirror layers of the first optical cavity and the second optical cavity, respectively.

In Example 17, at least one detection cell of the photodetector of Example 16 arranged in the first optical cavity or in the second optical cavity further contains a first charge transport layer and a second charge transport layer between which the photoactive layer is arranged, wherein the first charge transport layer, the photoactive layer, and the second charge transport layer are arranged one above the other along the length of the first optical cavity or the second optical cavity.

In Example 18, the number of detection cells of the photodetector arranged in the first optical cavity and/or in the second optical cavity according to Example 16 or 17 corresponds to the order of the respective resonant wave.

LIST OF REFERENCES

1-8 Photodetector according to a first aspect of the invention
9, 9' Photodetector according to a second aspect of the invention
10 Photodetector according to a third aspect of the invention
100-112, 110' Optoelectronic component
11, 11*a*, 11*b* First mirror layer
11' Semi-transparent mirror layer
12, 12*a*, 12*b* Second mirror layer
13, 13*a*, 13*b* 2nd-order resonance wave
14 3rd-order resonance wave
15, 15*a*, 15*b* 1st-order resonance wave
21, 21*a*, 21*b*, 21', Detection cell
22, 22*a*, 22*b*, 23
210, 220, 230 Photoactive layer
211, 221, 231 First charge transport layer
212, 222, 232 Second charge transport layer
30 Optically absorbing, electrically conductive intermediate layer
31 Optically absorbing intermediate layer
40 Spacer layer
50 Optically transparent, electrically conducting contact layer
60, 60' Electrical outer contact
201 First substrate
202 Second substrate
300 Radiation source
301 Incident radiation
L Length of optical cavity
$L_a$ Length of first optical cavity
$L_b$ Length of second optical cavity
α Angle of incidence of incident radiation

The invention claimed is:

1. A photodetector for detecting electromagnetic radiation in a spectrally selective manner, having a first optoelectronic component for detecting a first wavelength of the electromagnetic radiation, comprising:

a first optical cavity formed by two mutually spaced parallel mirror layers, wherein the length of the first optical cavity is such that for the first wavelength an ith-order resonant wave associated therewith is formed in the first optical cavity, and at least one detection cell arranged in the first optical cavity, each detection cell containing a photoactive layer, the photoactive layer being arranged in each case within the first optical cavity in such a way that exactly one oscillation maximum of the resonant wave lies within the photoactive layer, wherein the order of the resonant wave of the first optoelectronic component is greater than 1, wherein in said first optical cavity, at least one optically absorbing intermediate layer is respectively arranged such that an oscillation node of said resonant wave is located in said absorbing intermediate layer, said absorbing intermediate layer being adapted to absorb as much energy of a specific electromagnetic wave within said first optical cavity as to cancel it, said specific electromagnetic wave having a wavelength different from the resonant wavelength associated with said first wavelength, wherein (i) said optically absorbing intermediate layer is made of a metal or a metal mixture, the optically absorbing intermediate layer having a thickness in the range of 5 nm to 40 nm, or (ii) said optically absorbing intermediate layer is made of a conductive oxide, the optically absorbing intermediate layer having a thickness in the range of 20 nm to 100 nm, or (iii) said optically absorbing intermediate layer is made of a layer of organic small molecules, an organic mixed layer or a polymer being a doped hole-conducting material, such as a hole-conducting material comprising MeO-TPD:F6TCNNQ or PEDOT:PSS with quantum dots (QD), and/or at least one optically transparent contact layer is arranged in the first optical cavity, which contact layer is directly adjacent to one of the at least one detection cell, consists of an electrically conductive material and is suitable for being connected in an electrically conductive manner to an evaluation unit which is suitable for evaluating the electrical signals generated by the at least one detection cell of the first optoelectronic component.

2. The photodetector according to claim 1, wherein at least one detection cell arranged in the first optical cavity further contains a first charge transport layer and a second charge transport layer between which the photoactive layer is arranged, wherein the first charge transport layer, the photoactive layer, and the second charge transport layer are arranged one on top of the other along the length of the first optical cavity.

3. The photodetector according to claim 1, wherein the number of detection cells arranged in the first optical cavity corresponds to the order of the resonance wave.

4. The photodetector according to claim 1, wherein at least one optically absorbing intermediate layer is arranged in the first optical cavity and at least one of the at least one optically absorbing intermediate layer is directly adjacent to one of the at least one detection cell, consists of an electrically conductive material and is suitable to be connected in an electrically conductive manner to an evaluation unit suitable to evaluate the electrical signals generated by the at least one detection cell of the first optoelectronic component.

5. The photodetector according to claim 1, wherein the first optoelectronic component comprises at least one outer contact, which is adjacent to an outer surface of one of the at least one detection cell, consists of an electrically conductive material, and is adapted to be connected in an electrically conductive manner to an evaluation unit suitable to evaluate the electrical signals generated by the at least one detection cell of the first optoelectronic component.

6. The photodetector according to claim 1, wherein at least one optically transparent spacer layer is arranged in the first optical cavity, which spacer layer is arranged between one of the mirror layers and a detection cell adjacent to this mirror layer.

7. The photodetector according to claim 1, wherein at least two detection cells are arranged in the first optical cavity and an optically transparent spacer layer is arranged between two detection cells arranged one above the other in the first optical cavity along the length of the first optical cavity.

8. The photodetector according to claim 1, wherein the photodetector contains a second optoelectronic component for detecting a second wavelength of electromagnetic radiation, the second optoelectronic component comprising:

a second optical cavity formed by two mutually spaced parallel mirror layers, the length of the second optical cavity being such that, for the second wavelength, a jth-order resonant wave associated therewith is formed in the second optical cavity, and at least one detection cell arranged in the second optical cavity, each detection cell containing a photoactive layer, the photoactive layer being arranged in each case within the second optical cavity in such a way that exactly one oscillation maximum of the resonant wave lies within the photoactive layer, and the length of the first optical cavity differs from the length of the second optical cavity and/or the order of the resonant wave associated with the second wavelength differs from the order of the resonant wave associated with the first wavelength.

9. The photodetector according to claim 8, wherein said first and second optoelectronic components are arranged side by side along a direction perpendicular to the length of said first and second optical cavities.

10. The photodetector according to claim 8, wherein the first and second optoelectronic components are arranged one above the other so that the lengths of the first optical cavity and the second optical cavity extend along a common line, the first and second optical cavities being interconnected by a semitransparent mirror layer.

11. The photodetector according to claim 2, wherein the number of detection cells arranged in the first optical cavity corresponds to the order of the resonance wave.

12. The photodetector according to claim 11, wherein:

at least one optically absorbing intermediate layer is arranged in the first optical cavity and at least one of the at least one optically absorbing intermediate layer is directly adjacent to one of the at least one detection cell, consists of an electrically conductive material and is suitable to be connected in an electrically conductive manner to an evaluation unit suitable to evaluate the electrical signals generated by the at least one detection cell of the first optoelectronic component;

the first optoelectronic component comprises at least one outer contact, which is adjacent to an outer surface of one of the at least one detection cell, consists of an electrically conductive material, and is adapted to be connected in an electrically conductive manner to an evaluation unit suitable to evaluate the electrical signals generated by the at least one detection cell of the first optoelectronic component; and at least one optically transparent spacer layer is arranged in the first optical cavity, which spacer layer is arranged between one of the mirror layers and a detection cell adjacent to this mirror layer.

13. The photodetector according to claim 12, wherein at least two detection cells are arranged in the first optical cavity and an optically transparent spacer layer is arranged between two detection cells arranged one above the other in the first optical cavity along the length of the first optical cavity.

14. The photodetector according to claim 13, wherein the photodetector contains a second optoelectronic component for detecting a second wavelength of electromagnetic radiation, the second optoelectronic component comprising:

a second optical cavity formed by two mutually spaced parallel mirror layers, the length of the second optical cavity being such that, for the second wavelength, a jth-order resonant wave associated therewith is formed in the second optical cavity, and at least one detection cell arranged in the second optical cavity, each detection cell containing a photoactive layer, the photoactive layer being arranged in each case within the second optical cavity in such a way that exactly one oscillation maximum of the resonant wave lies within the photoactive layer, and the length of the first optical cavity differs from the length of the second optical cavity and/or the order of the resonant wave associated with the second wavelength differs from the order of the resonant wave associated with the first wavelength.

* * * * *